United States Patent
Kobayashi et al.

(10) Patent No.: US 10,734,089 B2
(45) Date of Patent: Aug. 4, 2020

(54) SEMICONDUCTOR DEVICE, DISPLAY MODULE, AND ELECTRONIC DEVICE

(71) Applicant: SEMICONDUCTOR ENERGY LABORATORY CO., LTD., Atsugi-shi, Kanagawa-ken (JP)

(72) Inventors: Hidetomo Kobayashi, Kanagawa (JP); Kei Takahashi, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/173,759

(22) Filed: Jun. 6, 2016

(65) Prior Publication Data

US 2016/0358575 A1    Dec. 8, 2016

(30) Foreign Application Priority Data

Jun. 8, 2015  (JP) .................................. 2015-115516

(51) Int. Cl.
*G11C 19/28*     (2006.01)
*G09G 3/3275*    (2016.01)
*G09G 3/36*      (2006.01)

(52) U.S. Cl.
CPC ............ *G11C 19/28* (2013.01); *G09G 3/3275* (2013.01); *G09G 3/3688* (2013.01); *G09G 2300/0426* (2013.01); *G09G 2310/0286* (2013.01); *G09G 2320/0223* (2013.01)

(58) Field of Classification Search
CPC ..... G09G 3/3688; G09G 3/3275; G11C 19/28
See application file for complete search history.

(56) References Cited

U.S. PATENT DOCUMENTS

| | | | | |
|---|---|---|---|---|
| 5,781,171 A | * | 7/1998 | Kihara | G09G 3/3688 345/93 |
| 6,538,631 B1 | * | 3/2003 | Kwon | G09G 3/2011 345/100 |
| 7,259,741 B2 | * | 8/2007 | Morita | G09G 3/20 345/100 |

(Continued)

FOREIGN PATENT DOCUMENTS

| | | |
|---|---|---|
| JP | 2004-046009 A | 2/2004 |
| JP | 2004-272100 A | 9/2004 |

(Continued)

*Primary Examiner* — Nitin Patel
*Assistant Examiner* — Robert M Stone
(74) *Attorney, Agent, or Firm* — Nixon Peabody LLP; Jeffrey L. Costellia

(57) ABSTRACT

A semiconductor device in which an increase in the degree of wiring congestion due to an increase in the number of output terminals of a driver IC can be reduced is provided. In a shift register of the driver IC, pulse signals are sequentially output in different directions. For example, pulse signal output circuits are provided so as to sequentially output pulse signals in ascending order from right to left and then sequentially output pulse signals in ascending order from left to right. With such a structure, output signals of the driver IC can be output not only from a side opposite to a side along which an input terminal is provided, but also from a side along which the input terminal is provided; thus, the number of output terminals can be increased without an increase in the degree of wiring congestion.

10 Claims, 16 Drawing Sheets

(56) References Cited

U.S. PATENT DOCUMENTS

| | | | |
|---|---|---|---|
| 7,262,757 B2* | 8/2007 | Morita | G09G 3/3648 345/100 |
| 7,375,709 B2 | 5/2008 | Toriumi et al. | |
| 7,443,202 B2 | 10/2008 | Kimura et al. | |
| 7,515,240 B2* | 4/2009 | Lu | G02F 1/13452 349/149 |
| 7,671,830 B2* | 3/2010 | Kamio | G09G 3/3614 345/1.2 |
| 7,687,808 B2 | 3/2010 | Umezaki | |
| 7,755,565 B2* | 7/2010 | Park | G09G 3/3677 345/1.1 |
| 7,830,332 B2* | 11/2010 | Park | G09G 5/006 345/1.1 |
| 8,054,279 B2 | 11/2011 | Umezaki et al. | |
| 8,330,492 B2 | 12/2012 | Umezaki | |
| 8,405,650 B2* | 3/2013 | Umezaki | G09G 3/3208 345/204 |
| 8,476,929 B2 | 7/2013 | Kimura | |
| 8,526,567 B2 | 9/2013 | Koyama | |
| 8,564,529 B2 | 10/2013 | Kurokawa et al. | |
| 8,785,928 B2 | 7/2014 | Yamazaki et al. | |
| 8,803,776 B2* | 8/2014 | Saito | G02F 1/1345 345/1.1 |
| 8,830,278 B2 | 9/2014 | Koyama et al. | |
| 8,872,751 B2 | 10/2014 | Kimura et al. | |
| 8,995,607 B2 | 3/2015 | Miyake et al. | |
| 9,041,453 B2 | 5/2015 | Miyake et al. | |
| 9,053,675 B2 | 6/2015 | Miyake et al. | |
| 9,058,889 B2 | 6/2015 | Miyake | |
| 9,070,546 B2 | 6/2015 | Umezaki | |
| 9,184,210 B2 | 11/2015 | Koyama | |
| 9,208,742 B2 | 12/2015 | Miyake et al. | |
| 9,412,764 B2 | 8/2016 | Yamazaki et al. | |
| 9,489,908 B2 | 11/2016 | Marushima et al. | |
| 10,283,070 B2* | 5/2019 | Jeon | G09G 3/3648 |
| 10,388,243 B2* | 8/2019 | Chang | G09G 3/3688 |
| 2001/0003447 A1* | 6/2001 | Murai | G09G 3/3666 345/99 |
| 2003/0227433 A1* | 12/2003 | Moon | G09G 3/3677 345/100 |
| 2004/0021616 A1* | 2/2004 | Goto | G09G 3/3644 345/1.1 |
| 2004/0100431 A1* | 5/2004 | Yoshida | G09G 3/20 345/82 |
| 2004/0169618 A1* | 9/2004 | Nakai | G02F 1/1362 345/1.1 |
| 2004/0212631 A1* | 10/2004 | Toriumi | G09G 3/20 345/690 |
| 2004/0233184 A1* | 11/2004 | Toriumi | G09G 3/3688 345/204 |
| 2004/0233227 A1* | 11/2004 | Toriumi | G09G 3/3648 345/690 |
| 2004/0263759 A1* | 12/2004 | Matsuhira | G02F 1/13452 349/151 |
| 2005/0008114 A1* | 1/2005 | Moon | G09G 3/3677 377/64 |
| 2005/0196981 A1* | 9/2005 | Hashimoto | G02F 1/13452 439/67 |
| 2005/0206605 A1* | 9/2005 | Park | G09G 3/3648 345/98 |
| 2005/0253773 A1* | 11/2005 | Sekiguchi | G06F 3/1423 345/1.1 |
| 2006/0170637 A1* | 8/2006 | Lin | G02F 1/13452 345/96 |
| 2006/0267886 A1* | 11/2006 | Ozaki | G09G 3/325 345/76 |
| 2007/0206136 A1* | 9/2007 | Lin | G02F 1/13454 349/106 |
| 2007/0211084 A1* | 9/2007 | Ohtani | H01L 27/3209 345/690 |
| 2007/0222717 A1* | 9/2007 | Maede | G09G 3/3216 345/76 |
| 2008/0192038 A1* | 8/2008 | Liu | G09G 3/20 345/206 |
| 2009/0167730 A1* | 7/2009 | Kwak | G09G 3/3688 345/204 |
| 2009/0243985 A1* | 10/2009 | Park | G02F 1/1345 345/92 |
| 2010/0182306 A1 | 7/2010 | Kimura et al. | |
| 2012/0146972 A1 | 6/2012 | Fujikawa | |
| 2013/0088468 A1 | 4/2013 | Sakakura et al. | |
| 2014/0002426 A1 | 1/2014 | Tanada et al. | |
| 2014/0139771 A1* | 5/2014 | Choi | G09G 3/20 349/43 |
| 2014/0313115 A1 | 10/2014 | Saito et al. | |
| 2015/0206509 A1* | 7/2015 | Moh | G09G 5/18 345/213 |
| 2015/0255492 A1 | 9/2015 | Takahashi et al. | |
| 2015/0263723 A1 | 9/2015 | Takahashi | |
| 2015/0270011 A1 | 9/2015 | Umezaki | |
| 2015/0302815 A1* | 10/2015 | Marushima | G02F 1/13452 345/3.2 |
| 2015/0310929 A1 | 10/2015 | Umezaki | |
| 2015/0317028 A1 | 11/2015 | Takahashi et al. | |
| 2016/0064424 A1 | 3/2016 | Umezaki | |
| 2016/0070314 A1 | 3/2016 | Takahashi et al. | |
| 2016/0071463 A1 | 3/2016 | Takahashi et al. | |
| 2016/0071478 A1 | 3/2016 | Takahashi et al. | |
| 2016/0155370 A1 | 6/2016 | Kimura | |
| 2016/0191052 A1 | 6/2016 | Kimura et al. | |
| 2016/0232834 A1 | 8/2016 | Kimura et al. | |
| 2016/0241255 A1 | 8/2016 | Takahashi | |
| 2016/0351552 A1 | 12/2016 | Takahashi et al. | |
| 2016/0358585 A1* | 12/2016 | Kobayashi | G11C 19/28 |
| 2017/0154595 A1* | 6/2017 | Kang | G09G 3/3677 |
| 2017/0213519 A1* | 7/2017 | Chang | G09G 3/3688 |
| 2018/0061344 A1* | 3/2018 | Kurokawa | G09G 3/3233 |
| 2018/0314354 A1* | 11/2018 | Tang | G06F 1/1647 |

FOREIGN PATENT DOCUMENTS

| | | |
|---|---|---|
| JP | 2005-107239 A | 4/2005 |
| JP | 2014-202992 A | 10/2014 |
| WO | WO-2014/077175 | 5/2014 |

* cited by examiner

SEMICONDUCTOR DEVICE, DISPLAY MODULE, AND ELECTRONIC DEVICE

BACKGROUND OF THE INVENTION

1. Field of the Invention

One embodiment of the present invention relates to a semiconductor device, a display module, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

Commoditization of display devices has progressed. As a result, display devices displaying ultra-high-definition images with a digital video format of 4K or 8K that can be regarded as an added value have been actively developed.

In a display device displaying a high-definition image, wirings such as gate lines and source lines are arranged at short intervals. A driver circuit of the display device sequentially outputs video signals or scan signals to the wirings in response to pulse signals. In particular, a source driver for driving the source lines needs to output the pulse signals for an extremely short time. For this reason, an integrated circuit (IC, hereinafter also referred to as driver IC) is used as a source driver (see Patent Documents 1 and 2, for example).

REFERENCES

Patent Documents

[Patent Document 1] United States Patent Application Publication No. 2012/0146972
[Patent Document 2] United States Patent Application Publication No. 2014/0313115

SUMMARY OF THE INVENTION

As described above, there are a variety of structures of semiconductor devices functioning as driver ICs. The structures have merits and demerits, and an appropriate structure is selected depending on circumstances. Thus, a proposal for a semiconductor device that has a novel structure and functions as a driver IC leads to higher degree of freedom of choice.

In view of the above, an object of one embodiment of the present invention is to provide a novel semiconductor device that has a structure different from that of an existing semiconductor device functioning as a driver IC, a novel module, a novel electronic device, or the like.

Note that the number of terminals (output terminals) outputting video signals of a driver IC is increased with an increase in the number of source lines. Therefore, a driver IC with which the frame of a display device can be narrower in spite of an increase in the number of output terminals has been required.

With an increase in the number of output terminals, the degree of wiring congestion in a driver IC is increased. For example, in the case where the direction in which circuits outputting pulse signals are sequentially arranged and the direction in which output terminals outputting video signals are sequentially arranged are different from each other, wirings in a driver IC are provided so as to intersect with each other. An increase in the degree of wiring congestion due to the intersection of wirings or the like leads to an increase in parasitic capacitance or parasitic resistance. An increase in parasitic capacitance or parasitic resistance might cause a decrease in display quality.

In view of the above, an object of one embodiment of the present invention is to provide a novel semiconductor device or the like the frame of which can be narrower in spite of an increase in the number of output terminals. Another object of one embodiment of the present invention is to provide a novel semiconductor device or the like in which the degree of wiring congestion is decreased. Another object of one embodiment of the present invention is to provide a novel semiconductor device or the like with improved display quality.

Note that objects of one embodiment of the present invention are not limited to the aforementioned objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention solves at least one of the aforementioned objects and the other objects.

One embodiment of the present invention is a semiconductor device including a shift register. The shift register includes a plurality of pulse output circuits. The shift register includes a first circuit and a second circuit. The first circuit includes the pulse output circuits for sequentially outputting pulse signals in a first direction. The second circuit includes the pulse output circuits for sequentially outputting pulse signals in a second direction. The first direction and the second direction are different from each other.

Another embodiment of the present invention is a semiconductor device including a shift register. The shift register includes a plurality of pulse output circuits. The shift register includes a first circuit and a second circuit. The first circuit includes the pulse output circuits for sequentially outputting first pulse signals in a first direction. The second circuit includes the pulse output circuits for sequentially outputting second pulse signals in a second direction. The first direction and the second direction are different from each other. First video signals generated in response to the first pulse signals are output from a first output terminal provided along a first side. Second video signals generated in response to the second pulse signals are output from a second output terminal provided along a second side, which is an opposite side of the first side.

Another embodiment of the present invention is a semiconductor device including a shift register. The shift register includes a plurality of pulse output circuits. The shift register includes a first circuit and a second circuit. The first circuit includes the pulse output circuits for sequentially outputting first pulse signals in a first direction. The second circuit includes the pulse output circuits for sequentially outputting second pulse signals in a second direction. The first direction and the second direction are different from each other. First video signals generated in response to the first pulse signals are output from a first output terminal provided along a first side. Second video signals generated in response to the second pulse signals are output from a second output terminal provided along a second side, which is an opposite side of the first side. An input terminal is provided along the first side or the second side.

In the semiconductor device of one embodiment of the present invention, the number of terminals of the input terminal is preferably smaller than the number of terminals of the second output terminal.

In the semiconductor device of one embodiment of the present invention, the first direction and the first side are preferably parallel to each other, and the second direction and the second side are preferably parallel to each other.

Note that other embodiments of the present invention will be described in the following embodiments and the drawings.

According to one embodiment of the present invention, a novel semiconductor device or the like can be provided. According to one embodiment of the present invention, a novel semiconductor device or the like the frame of which can be narrower in spite of an increase in the number of output terminals can be provided. According to one embodiment of the present invention, a novel semiconductor device or the like in which the degree of wiring congestion is decreased can be provided. According to one embodiment of the present invention, a novel semiconductor device or the like with improved display quality can be provided.

Note that the effects of one embodiment of the present invention are not limited to the above. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF THE DRAWINGS

FIGS. 7A and 7B are circuit diagrams illustrating one embodiment of the present invention.

DETAILED DESCRIPTION OF THE INVENTION

Figure 1:
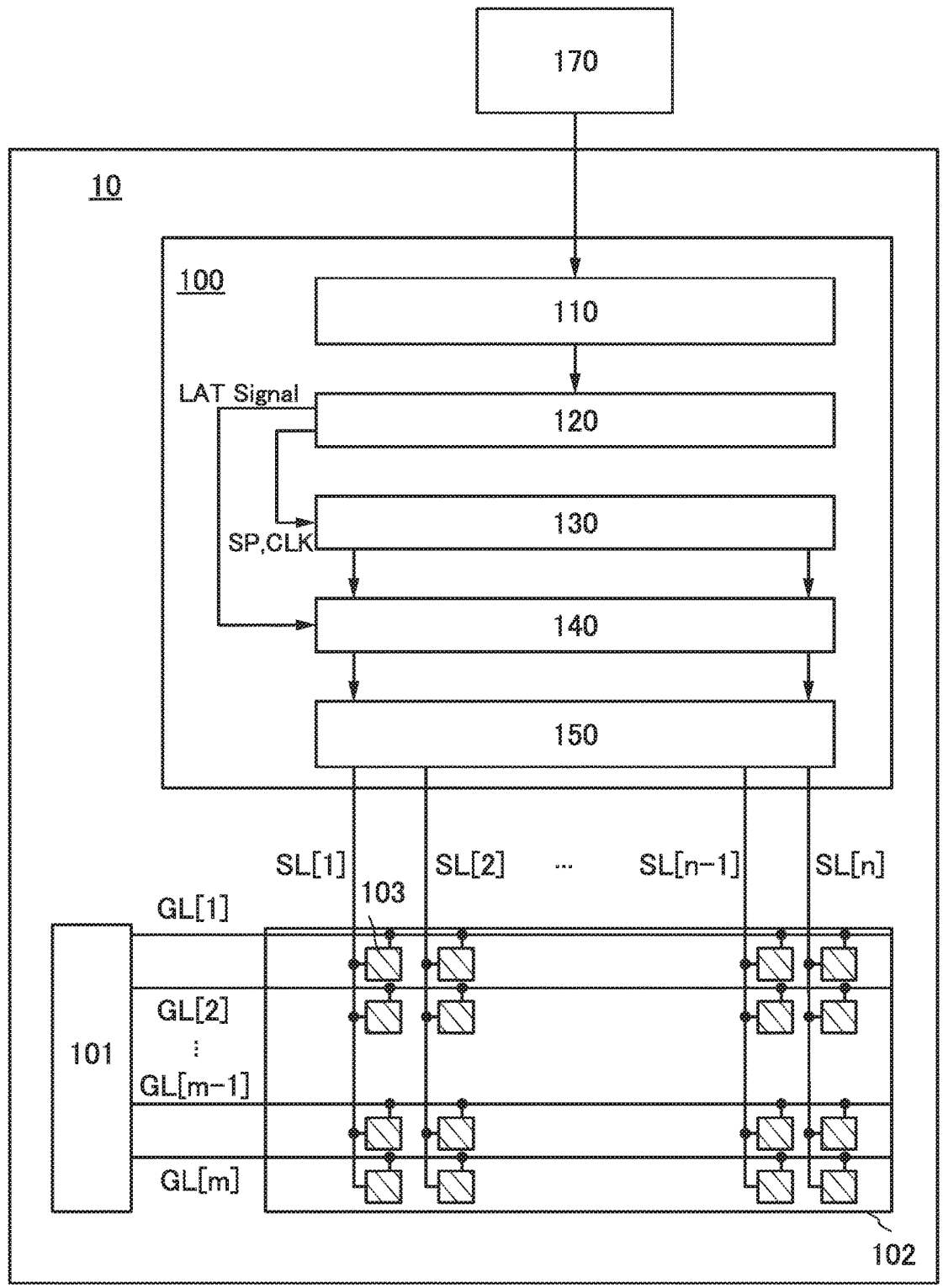
FIG. 1 is a block diagram illustrating one embodiment of the present invention.

Embodiments will be described below with reference to drawings. The embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as first, second, and third are used in order to avoid confusion among components. Thus, the terms do not limit the number or order of components. For example, in this specification and the like, a "first" component in one embodiment can be referred to as a "second" component in other embodiments or claims. Furthermore, in this specification and the like, a "first" component in one embodiment can be referred to without the ordinal number in other embodiments or claims.

The same elements or elements having similar functions, elements formed using the same material, elements formed at the same time, or the like in the drawings are denoted by the same reference numerals in some cases, and the description thereof is not repeated in some cases.

Embodiment 1

In this embodiment, an example of a semiconductor device functioning as a driver IC will be described.

In this specification and the like, a semiconductor device means any device that can function by utilizing semiconductor characteristics; thus, a driver IC composed of semiconductor elements such as transistors and a display device including the driver IC are included in the category of the semiconductor device.

<Structure of Display Device Including Semiconductor Device>

A semiconductor device of one embodiment of the present invention is applied to a driver IC functioning as a source driver, in the following description. Therefore, a source driver and a driver IC are each also referred to as a semiconductor device.

FIG. 1 is a block diagram of a display device 10 including a source driver. The display device 10 includes a source driver 100, a gate driver 101, and a display portion 102.

The display portion 102 includes pixels 103 arranged in a matrix. Each of the pixels 103 is connected to one of source lines SL[1] to SL[n] (n is a natural number) and one of gate lines GL[1] to GL[m] (m is a natural number), and is supplied with a video signal and a gate signal.

The pixel 103 includes a transistor and a display element such as a liquid crystal element or a light-emitting element. A pixel that can be used as the pixel 103 will be described in detail in the following embodiment.

The gate driver 101 has a function of supplying gate signals to the gate lines GL[1] to GL[m] sequentially. The gate driver 101 includes a shift register, a buffer circuit, or the like. The gate signal is also referred to as a scan signal or a selection signal. The gate line is also referred to as a scan line or a selection line.

The source driver 100 has a function of supplying video signals to the source lines SL[1] to SL[n] sequentially. The gate driver 101 includes an input terminal 110, a controller 120, a shift register 130, a video signal generation circuit 140, an output terminal 150, and the like. The video signal is also referred to as an image signal or a data signal. The source line is also referred to as a signal line or a data line.

To the input terminal 110, a signal for display is input from a host controller 170 which is provided outside the source driver 100. For example, through a flexible printed circuit (FPC) or the like, a signal can be input from the host controller 170 to the input terminal 110.

The input terminal 110 can receive signals which are serially input. For that reason, the input terminal 110 can receive signals without an increase in the number of terminals.

The controller 120 is a circuit for generating, on the basis of signals for display which are received by the input terminal 110, timing signals such as a start pulse SP, a clock signal CLK, and a latch signal LAT, another control signal Signal, and the like, and outputting them.

The shift register 130 is a circuit for generating a pulse signal on the basis of the start pulse SP, the clock signal CLK, and the like. In the shift register 130, pulse output circuits including flip-flops or the like are connected in cascade; thus, pulse signals can be sequentially output.

The order of outputting pulse signals from the pulse output circuits in the shift register 130 depends on the order of arranging the pulse output circuits. For example, in the case where the pulse output circuits in the 1st to 10th stages are arranged in ascending order from right to left, pulse signals are sequentially output in ascending order from right to left. Furthermore, for example, in the case where the pulse output circuits in the 11th to 20th stages are arranged in ascending order from left to right, pulse signals are sequentially output in ascending order from left to right.

The direction in which the pulse signals are sequentially output preferably coincides with the direction in which the output terminal 150 outputs video signals to the source lines SL[1] to SL[n] sequentially. The video signals generated by the video signal generation circuit 140 on the basis of the pulse signals are generated in the order of arranging the source lines SL[1] to SL[n]. In the case where the direction in which the pulse signals are sequentially output does not coincide with the order of arranging the source lines SL[1] to SL[n], i.e., the direction in which the output terminals are sequentially arranged, wirings need to intersect with each other in the source driver 100 in order that these directions coincide with each other. An increase in the frequency of intersection of the wirings in the circuit in this manner is also referred to as an increase in the degree of wiring congestion.

The video signal generation circuit 140 generates video signals on the basis of the pulse signals output from the shift register 130. The video signal generation circuit 140 includes, for example, a latch circuit, a D/A (digital/analog) converter circuit, a buffer circuit, and the like.

The output terminal 150 outputs the video signals generated by the video signal generation circuit 140 to the source lines SL[1] to SL[n] sequentially which are provided outside the source driver 100.

The number of terminals of the output terminal 150 corresponds to the number of the source lines SL[1] to SL[n]. Therefore, the number of terminals of the output terminal 150 is larger than that of terminals of the input terminal 110. Note that it is possible to output signals obtained by time division of the video signals from the output terminal 150 to the source lines SL[1] to SL[n] with the use of a switch or the like.

Figure 2A:
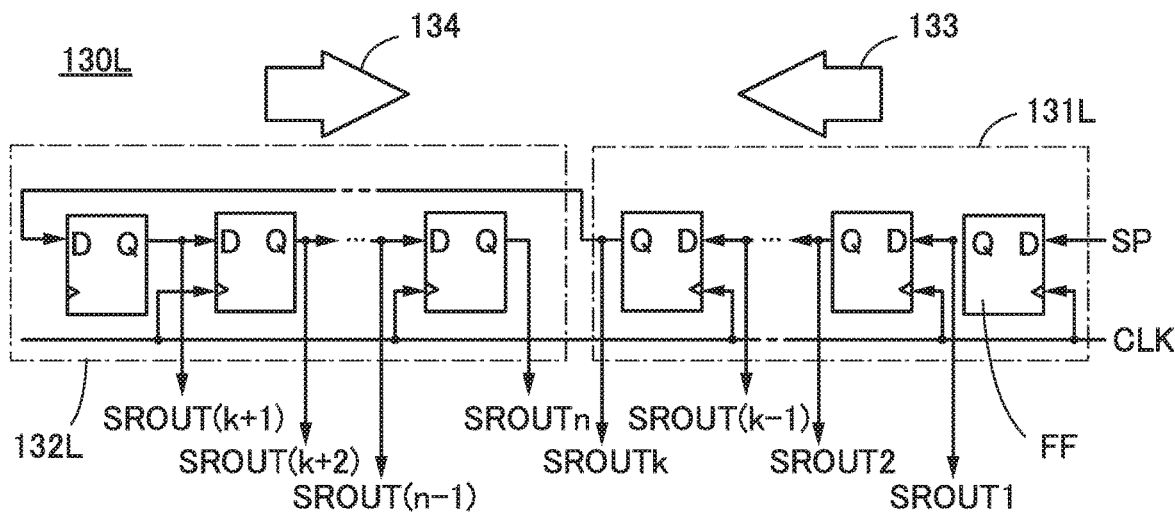
FIGS. 2A and 2B are block diagrams illustrating one embodiment of the present invention.

Next, the configuration of a shift register of one embodiment of the present invention will be described. In FIG. 2A, a shift register 130L that can be used as the shift register 130 in FIG. 1 includes a plurality of pulse output circuits FFs.

The shift register 130L includes a circuit 131L and a circuit 132L in which the plurality of pulse output circuits FFs are provided. In the circuit 131L, a start pulse SP and a clock signal CLK are input, and pulse signals are output to output terminals SROUT1 to SROUTk (k is a natural number less than n) sequentially. In the circuit 132L, the clock signal CLK and a pulse signal output from the output terminal SROUTk in the last stage of the circuit 131L are input, and pulse signals are output to output terminals SROUT(k+1) to SROUTn sequentially.

The circuit 131L is capable of sequentially outputting pulse signals in the direction indicated by an arrow 133. That is, the pulse output circuits in the first to k-th stages, which are arranged in ascending order from right to left, output pulse signals in ascending order from right to left. The circuit 132L is capable of sequentially outputting pulse signals in the direction indicated by an arrow 134. That is, the pulse output circuits in the (k+1)-th to n-th stages, which are arranged in ascending order from left to right, output pulse signals in ascending order from left to right.

Figure 2B:
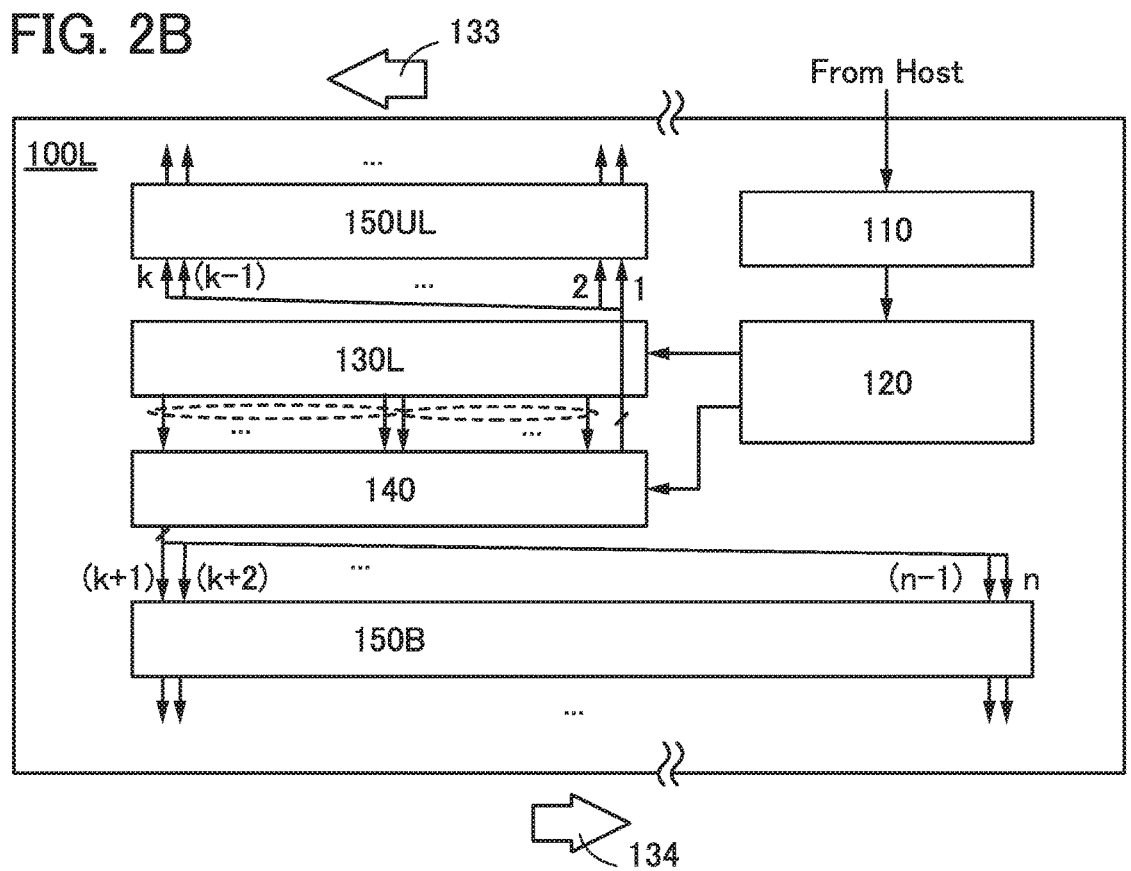

FIG. 2B is a block diagram illustrating the circuit layout of a source driver 100L that can be used as the source driver 100 illustrated in FIG. 1. The source driver 100L which is formed using an integrated circuit (IC) has a rectangular shape. The length in the short-axis direction of the source driver 100L is much shorter than that in the long-axis direction thereof; thus, the frame of a display device can be narrower.

As described above, the number of terminals of the input terminal in the source driver 100L is smaller than the number of terminals of the output terminal therein. For that reason, in one embodiment of the present invention, an output terminal 150UL and the input terminal 110 are positioned along one long side, and an output terminal 150B is positioned along the other long side, i.e., the opposite side of the one long side, as illustrated in FIG. 2B.

In the case where source lines connected to the output terminal 150UL are provided in a display portion in ascending order from left to right, video signals need to be output from the output terminal 150UL through terminals in the order from right to left because the source lines are arranged so as not to intersect with each other. Therefore, as illustrated in FIG. 2A, video signals generated by the video signal generation circuit 140 on the basis of pulse signals output from the pulse output circuits in the first to k-th stages can be output in the direction indicated by the arrow 133 in ascending order from right to left without an increase in the degree of wiring congestion.

In the case where source lines connected to the output terminal 150B are provided in the display portion in ascending order from left to right, video signals need to be output from the output terminal 150B through terminals in the order from left to right because the source lines are arranged so as not to intersect with each other. Therefore, as illustrated in FIG. 2A, video signals generated by the video signal generation circuit 140 on the basis of pulse signals output from the pulse output circuits in the (k+1)-th to n-th stages can be output in the direction indicated by the arrow 134 in ascending order from left to right without an increase in the degree of wiring congestion.

As described above, in one embodiment of the present invention, a shift register in a source driver includes a first circuit and a second circuit. The first circuit includes pulse output circuits that sequentially output first pulse signals in a first direction. The second circuit includes pulse output circuits that sequentially output second pulse signals in a second direction. The first direction and the second direction are different from each other. First video signals generated in response to the first pulse signals are output from a first output terminal provided along a first side. Second video signals generated in response to the second pulse signals are output from a second output terminal provided along a second side, which is the opposite side of the first side. An input terminal is provided along the first side or the second side.

Next, the relation between the source lines and the output terminals illustrated in FIG. 2B will be further described with reference to FIGS. 3A and 3B.

Figure 3A:
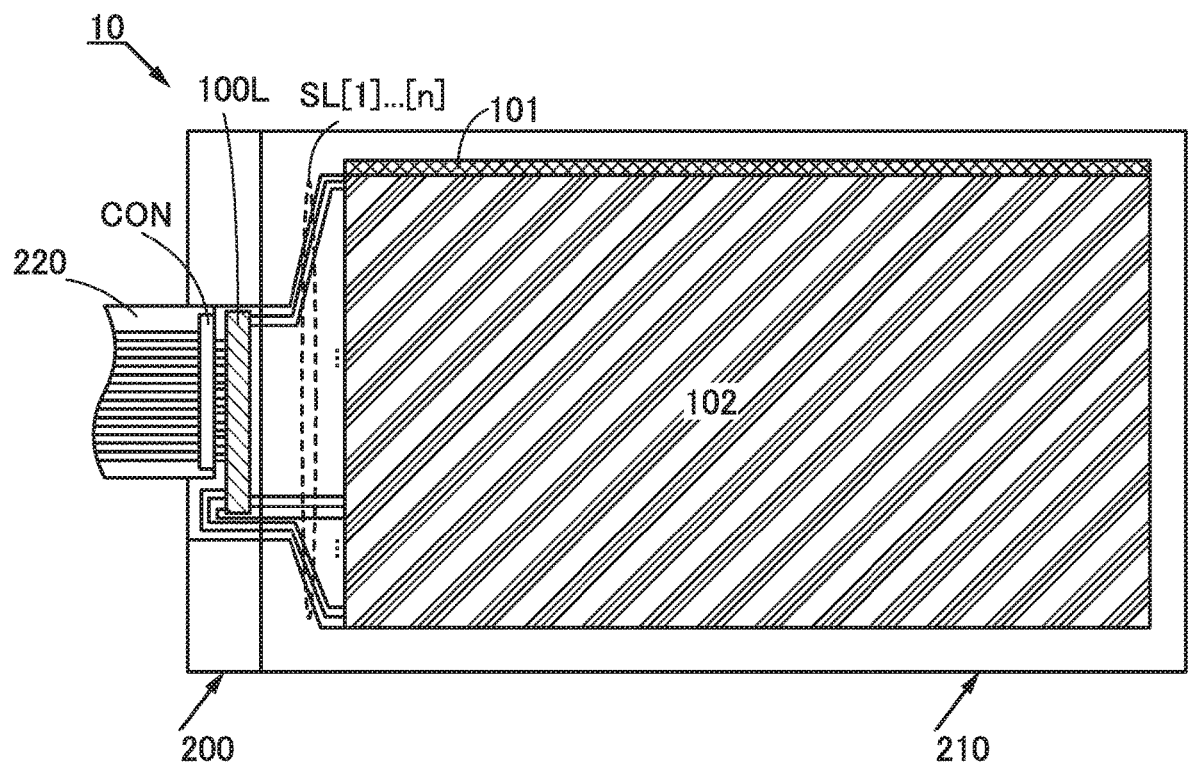
FIGS. 3A and 3B are top views illustrating one embodiment of the present invention.

FIG. 3A is a top view of the display device 10. FIG. 3B is an enlarged view of the source driver 100L and its vicinity. The display device 10 includes a pair of substrates 200 and 210. The display device 10 further includes the source driver 100L, the gate driver 101, and the display portion 102. On the substrate 200, an FPC 220 (flexible printed board) is connected to a connection portion CON. Wirings extended from the connection portion CON are connected to the input terminal 110 of the source driver 100L. The source lines SL[1] to SL[n] extended from the source driver 100L to the display portion 102 are connected to the output terminal 150UL and the output terminal 150B. Terminals 160 are provided in the input terminal 110, the output terminal 150UL, and the output terminal 150B.

Figure 3B:
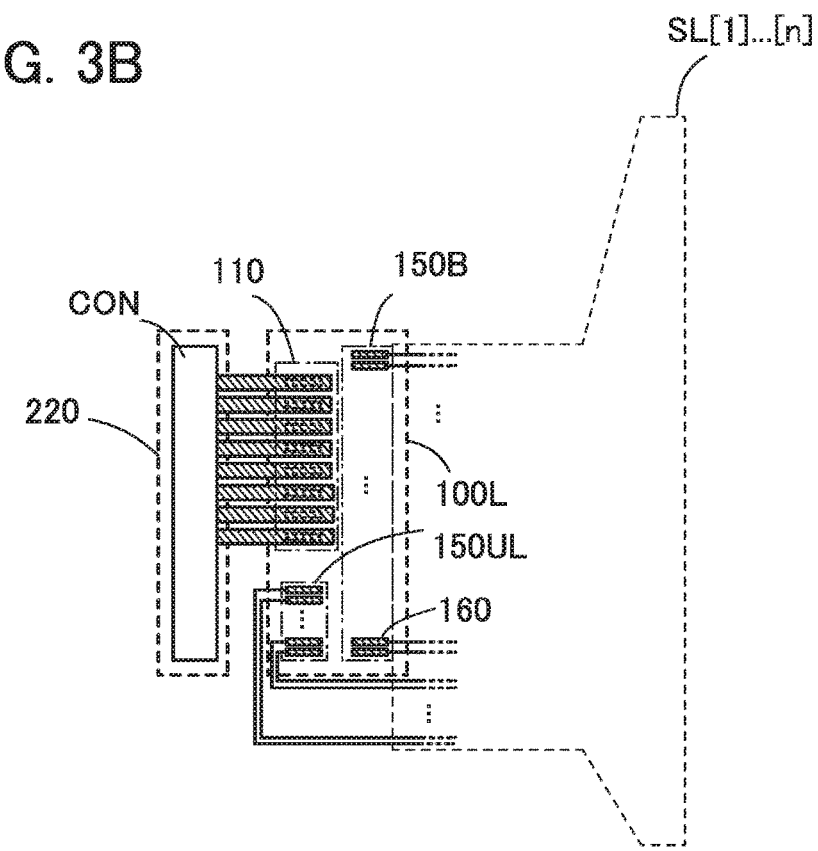

In the case where the output terminal 150UL and the output terminal 150B are provided along different sides as illustrated in FIGS. 3A and 3B, the direction in which the source lines SL[1] to SL[n] are arranged in ascending order and the direction in which video signals are sequentially generated on the basis of pulse signals are different from each other. For that reason, as illustrated in FIG. 2A, a shift register in a source driver includes a first circuit and a second circuit; the first circuit includes pulse output circuits that sequentially output first pulse signals in a first direction, and the second circuit includes pulse output circuits that sequentially output second pulse signals in a second direction. The first direction and the second direction are different from each other. With such a structure, video signals can be output without an increase in the degree of wiring congestion even when output terminals are provided along different sides.

In one embodiment of the present invention, the number of output terminals can be increased without an increase in the size of a source driver. Thus, the frame of a display device including the source driver can be narrower. Furthermore, in one embodiment of the present invention, the direction in which pulse signals are sequentially output from a shift register in the source driver and the direction in which output terminals output video signals to source lines SL[1] to SL[n] sequentially can coincide with each other. Therefore, the frequency of intersection of the wirings in the source driver can be reduced, and a decrease in the degree of wiring congestion can be achieved. Since the degree of wiring congestion can be decreased and the number of output terminals can be increased, video signals can be output from a circuit configuration in which parasitic capacitance and parasitic resistance are reduced; thus, the display quality of the display device can be improved.

Figure 4A:
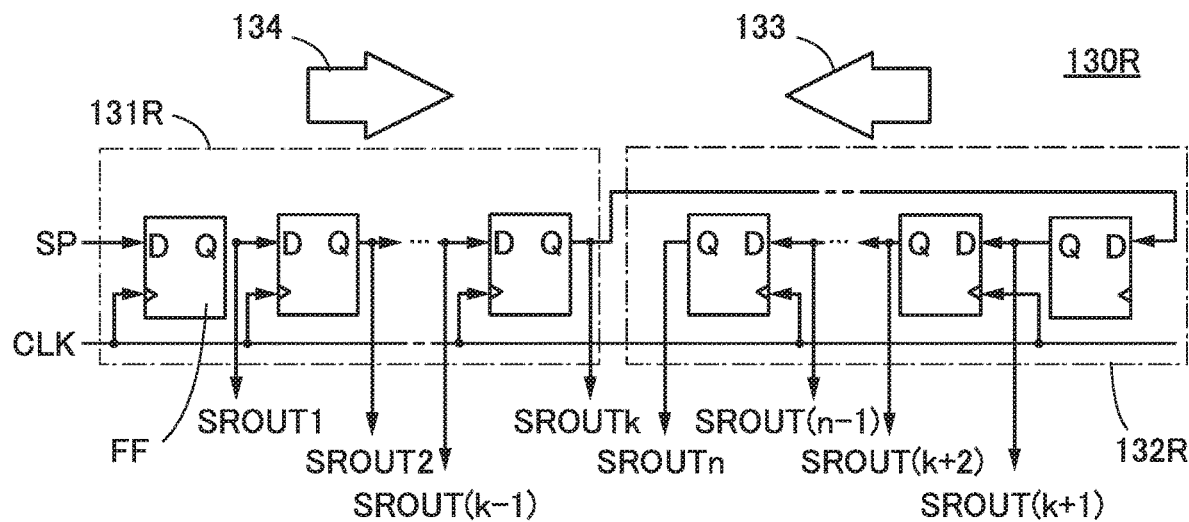
FIGS. 4A and 4B are block diagrams illustrating one embodiment of the present invention.
Figure 4B:
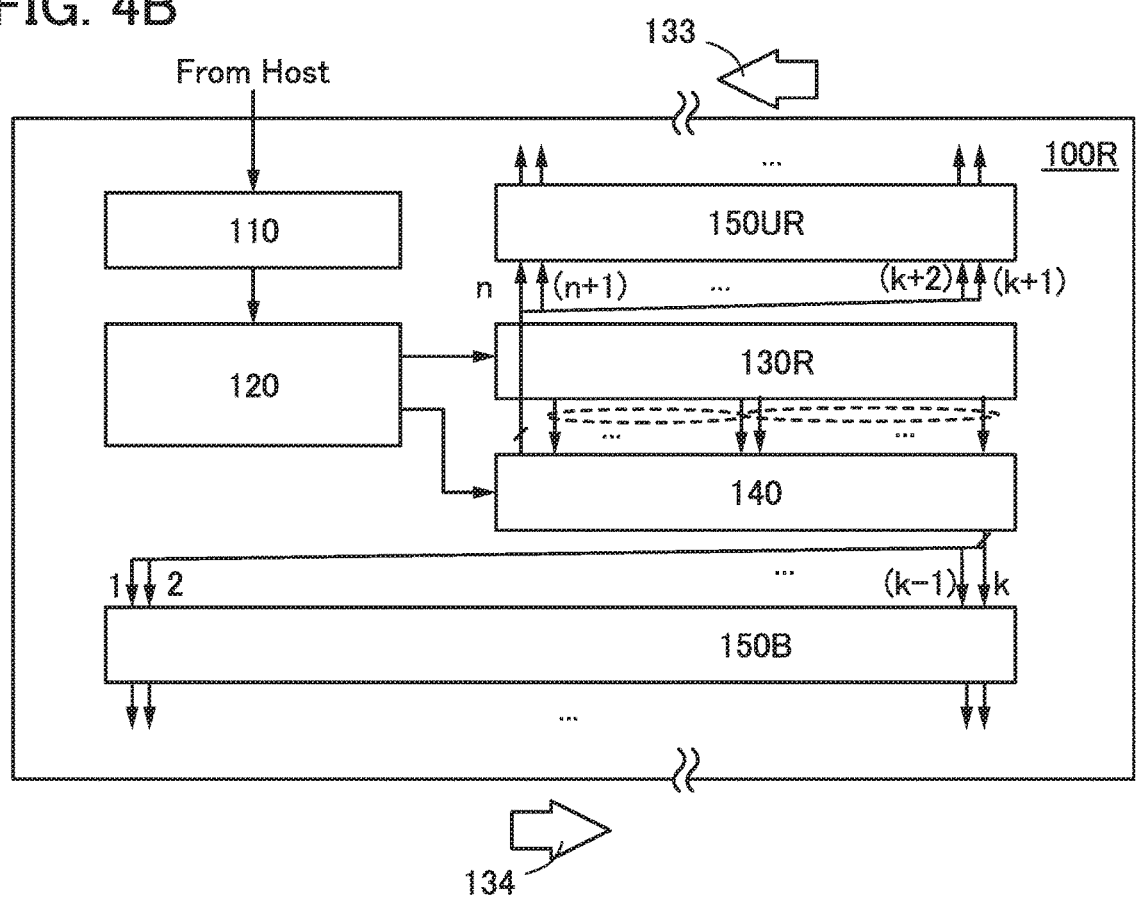

A structure different from the structure illustrated in FIGS. 2A and 2B can also be employed. FIGS. 4A and 4B illustrate a structure different from that illustrated in FIGS. 2A and 2B. In FIG. 4A, a shift register 130R that can be used as the shift register 130 in FIG. 1 includes a plurality of pulse output circuits FFs.

The shift register 130R includes a circuit 131R and a circuit 132R in which a plurality of pulse output circuits FFs are provided. In the circuit 131R, a start pulse SP and a clock signal CLK are input, and pulse signals are output to output terminals SROUT1 to SROUTk sequentially. In the circuit 132R, the clock signal CLK and a pulse signal output from the output terminal SROUTk in the last stage of the circuit 131R are input, and pulse signals are output to output terminals SROUT(k+1) to SROUTn sequentially.

The circuit 131R is capable of sequentially outputting pulse signals in the direction opposite to that illustrated in FIG. 2A, i.e., the direction indicated by the arrow 134. That is, the pulse output circuits in the first to k-th stages, which are arranged in ascending order from left to right, output pulse signals in ascending order from left to right. The circuit 132R is capable of sequentially outputting pulse signals in the direction opposite to that illustrated in FIG. 2A, i.e., the direction indicated by the arrow 133. That is, the pulse output circuits in the (k+1)-th to n-th stages, which are arranged in ascending order from right to left, output pulse signals in ascending order from right to left.

FIG. 4B is a block diagram illustrating the circuit layout of a source driver 100R that can be used as the source driver 100 illustrated in FIG. 1. The source driver 100R which is formed using an IC has a rectangular shape. The length in the short-axis direction of the source driver 100R is much shorter than that in the long-axis direction thereof; thus, the frame of a display device can be narrower.

As described above, the number of terminals of the input terminal in the source driver 100R is smaller than the number of terminals of the output terminal therein. For that reason, in one embodiment of the present invention, an output terminal 150UR and the input terminal 110 are positioned along one long side, and the output terminal 150B is positioned along the other long side, i.e., the opposite side of the one long side, as illustrated in FIG. 4B.

In the case where source lines connected to the output terminal 150B are provided in a display portion in ascending order from left to right, video signals need to be output from the output terminal 150B through terminals in the order from left to right because the source lines are arranged so as not to intersect with each other. Therefore, as illustrated in FIG. 4A, video signals generated by the video signal generation circuit 140 on the basis of pulse signals output from the pulse output circuits in the first to k-th stages can be output in the direction indicated by the arrow 134 in ascending order from left to right without an increase in the degree of wiring congestion.

In the case where source lines connected to the output terminal 150UR are provided in the display portion in ascending order from left to right, video signals need to be output from the output terminal 150UR through terminals in the order from right to left because the source lines are arranged so as not to intersect with each other. Therefore, as illustrated in FIG. 4A, video signals generated by the video signal generation circuit 140 on the basis of pulse signals output from the pulse output circuits in the (k+1)-th to n-th stages can be output in the direction indicated by the arrow 133 in ascending order from right to left without an increase in the degree of wiring congestion.

Figure 5:
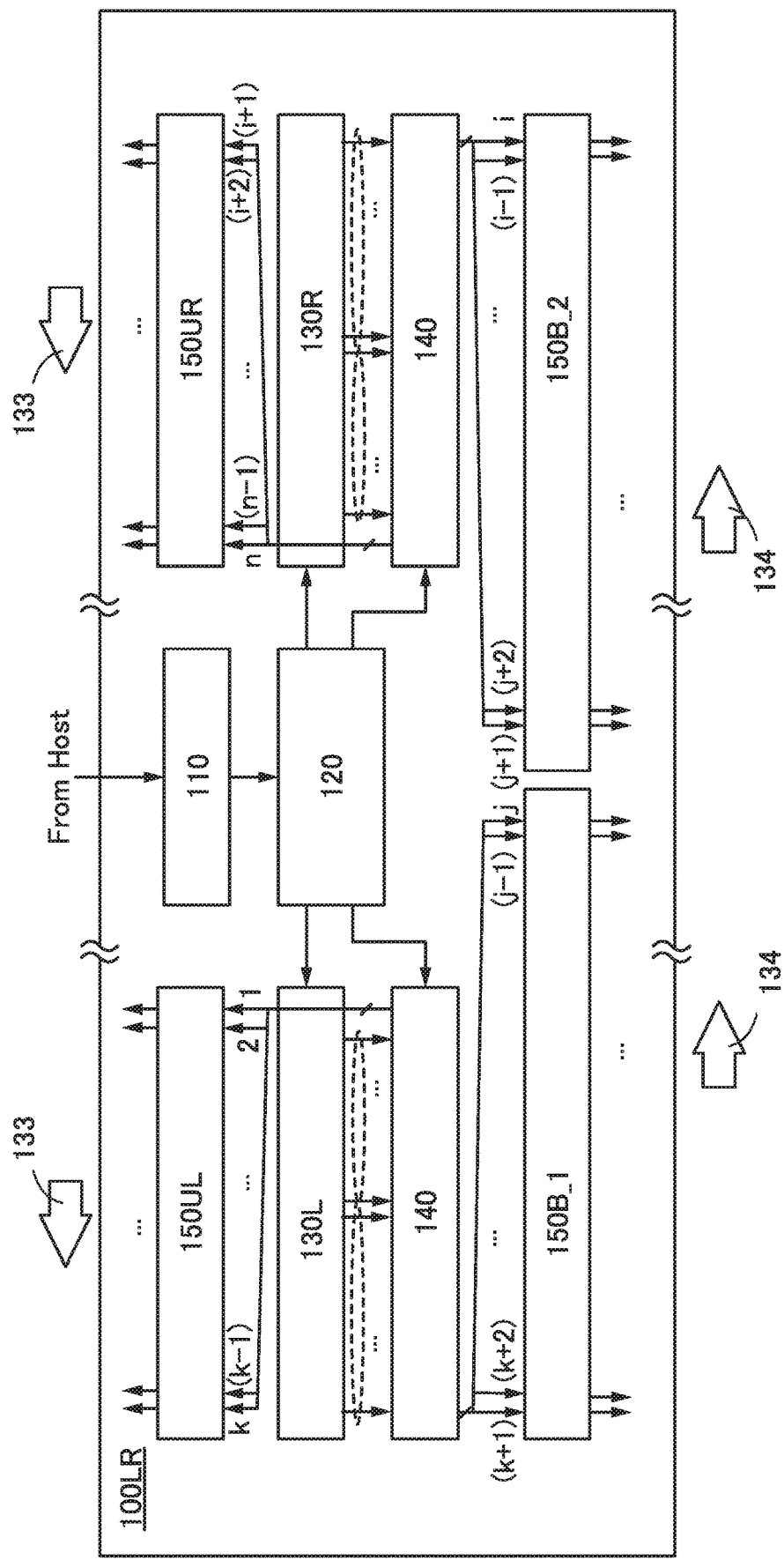
FIG. 5 is a block diagram illustrating one embodiment of the present invention.

Note that the structures illustrated in FIG. 2B and FIG. 4B can be combined with each other. FIG. 5 illustrates a structure in which the structures illustrated in FIG. 2B and FIG. 4B are combined with each other. FIG. 5 is a block diagram illustrating the circuit layout of a source driver 100LR that can be used as the source driver 100 illustrated in FIG. 1. The source driver 100LR which is formed using an IC has a rectangular shape. The length in the short-axis direction of the source driver 100LR is much shorter than that in the long-axis direction thereof; thus, the frame of a display device can be narrower.

As described above, the number of terminals of the input terminal in the source driver 100LR is smaller than the number of terminals of the output terminal therein. For that reason, in one embodiment of the present invention, the output terminal 150UL, the output terminal 150UR, and the input terminal 110 are positioned along one long side, and an output terminal 150B_1 and an output terminal 150B_2 are positioned along the other long side, i.e., the opposite side of the one long side, as illustrated in FIG. 5.

In the case where source lines connected to the output terminal 150UL are provided in a display portion in ascending order from left to right, video signals need to be output from the output terminal 150UL through terminals in the order from right to left because the source lines are arranged so as not to intersect with each other. Therefore, as illustrated in FIG. 5, video signals generated by the video signal generation circuit 140 on the basis of pulse signals output from the pulse output circuits in the first to k-th stages can be output in the direction indicated by the arrow 133 in ascending order from right to left without an increase in the degree of wiring congestion.

In the case where source lines connected to the output terminal 150B_1 and the output terminal 150 B_2 are provided in the display portion in ascending order from left to right, video signals need to be output from the output terminal 150B_1 and the output terminal 150 B_2 through terminals in the order from left to right because the source lines are arranged so as not to intersect with each other. Therefore, as illustrated in FIG. 5, video signals generated by the video signal generation circuit 140 on the basis of pulse signals output from the pulse output circuits in the (k+1)-th to j-th stages (j is a natural number less than i) and the pulse output circuits in the (j+1)-th to i-th stages (i is a natural number less than n) can be output in the direction indicated by the arrow 134 in ascending order from left to right without an increase in the degree of wiring congestion.

In the case where source lines connected to the output terminal 150UR are provided in the display portion in ascending order from left to right, video signals need to be output from the output terminal 150UR through terminals in the order from right to left because the source lines are arranged so as not to intersect with each other. Therefore, as illustrated in FIG. 4A, video signals generated by the video signal generation circuit 140 on the basis of pulse signals output from the pulse output circuits in the (i+1)-th to n-th stages can be output in the direction indicated by the arrow 133 in ascending order from right to left without an increase in the degree of wiring congestion.

Next, the relation between the source lines and the output terminals illustrated in FIG. 5 will be further described with reference to FIGS. 6A and 6B.

Figure 6A:
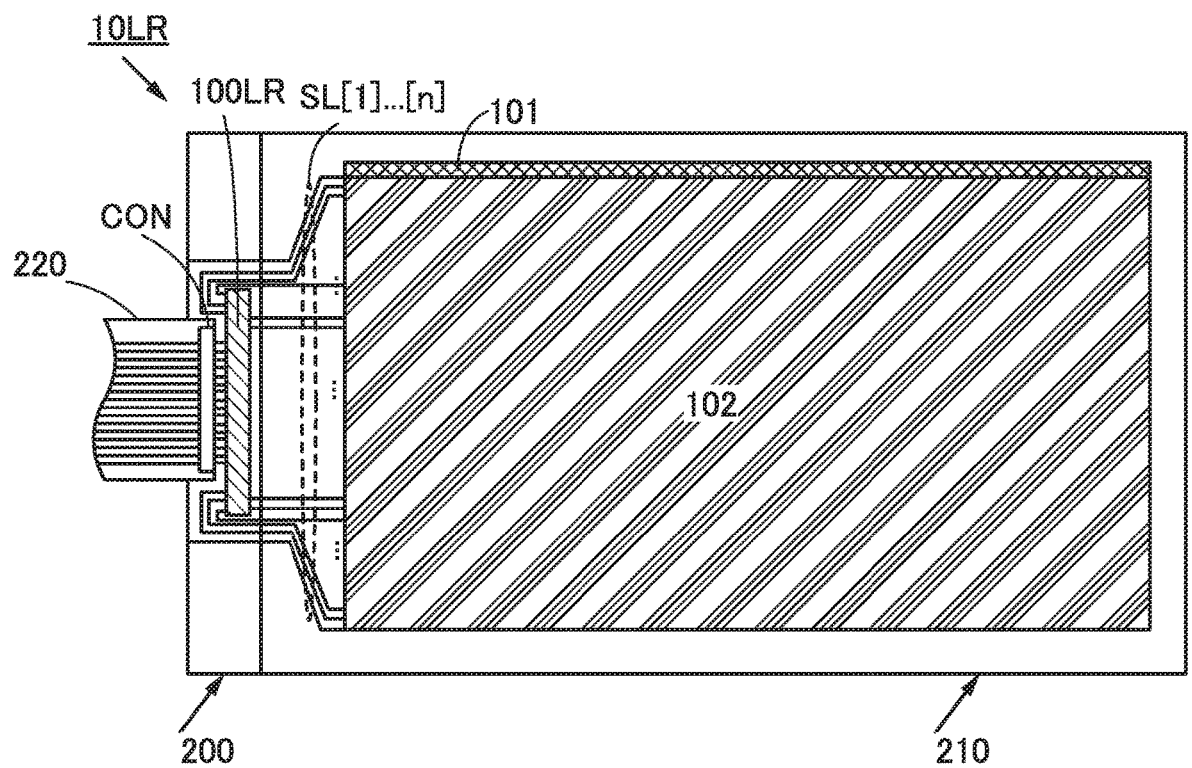
FIGS. 6A and 6B are top views illustrating one embodiment of the present invention.

FIG. 6A is a top view of a display device 10LR. FIG. 6B is an enlarged view of the source driver 100LR and its vicinity. The display device 10LR includes the pair of substrates 200 and 210. The display device 10LR further includes the source driver 100LR, the gate driver 101, and the display portion 102. On the substrate 200, the FPC 220 is connected to the connection portion CON. Wirings extended from the connection portion CON are connected to the input terminal 110 of the source driver 100LR. The source lines SL[1] to SL[n] extended from the source driver 100LR to the display portion 102 are connected to the output terminal 150UL, the output terminal 150B_1, the output terminal 150B_2, and the output terminal 150UR. The terminals 160 are provided in the input terminal 110, the output terminal 150UL, the output terminal 150B_1, the output terminal 150B_2, and the output terminal 150UR.

Figure 6B:
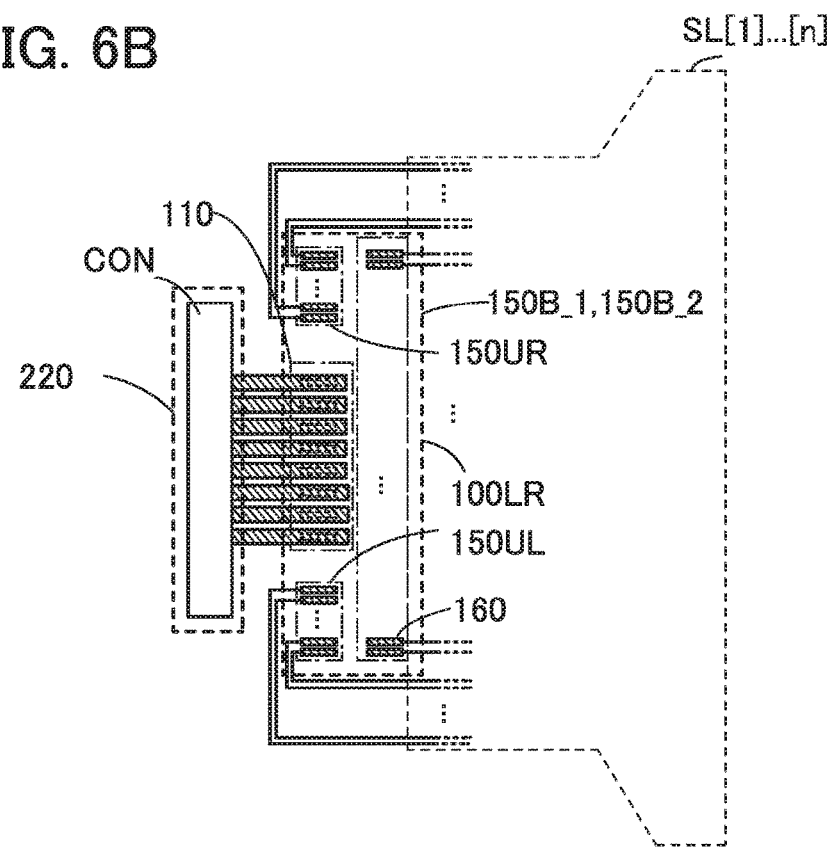

In the case where the output terminals 150UL and 150UR and the output terminals 150 B_1 and 150B_2 are provided along different sides as illustrated in FIGS. 6A and 6B, the direction in which the source lines SL[1] to SL[n] are arranged in ascending order and the direction in which video signals are sequentially generated on the basis of pulse signals are different from each other. For that reason, as illustrated in FIG. 5, a shift register in a source driver includes a first circuit and a second circuit; the first circuit includes pulse output circuits that sequentially output first pulse signals in a first direction, and the second circuit includes pulse output circuits that sequentially output second pulse signals in a second direction. The first direction and the second direction are different from each other. With such a structure, video signals can be output without an increase in the degree of wiring congestion even when output terminals are provided along different sides.

Figures 7A, 7B:
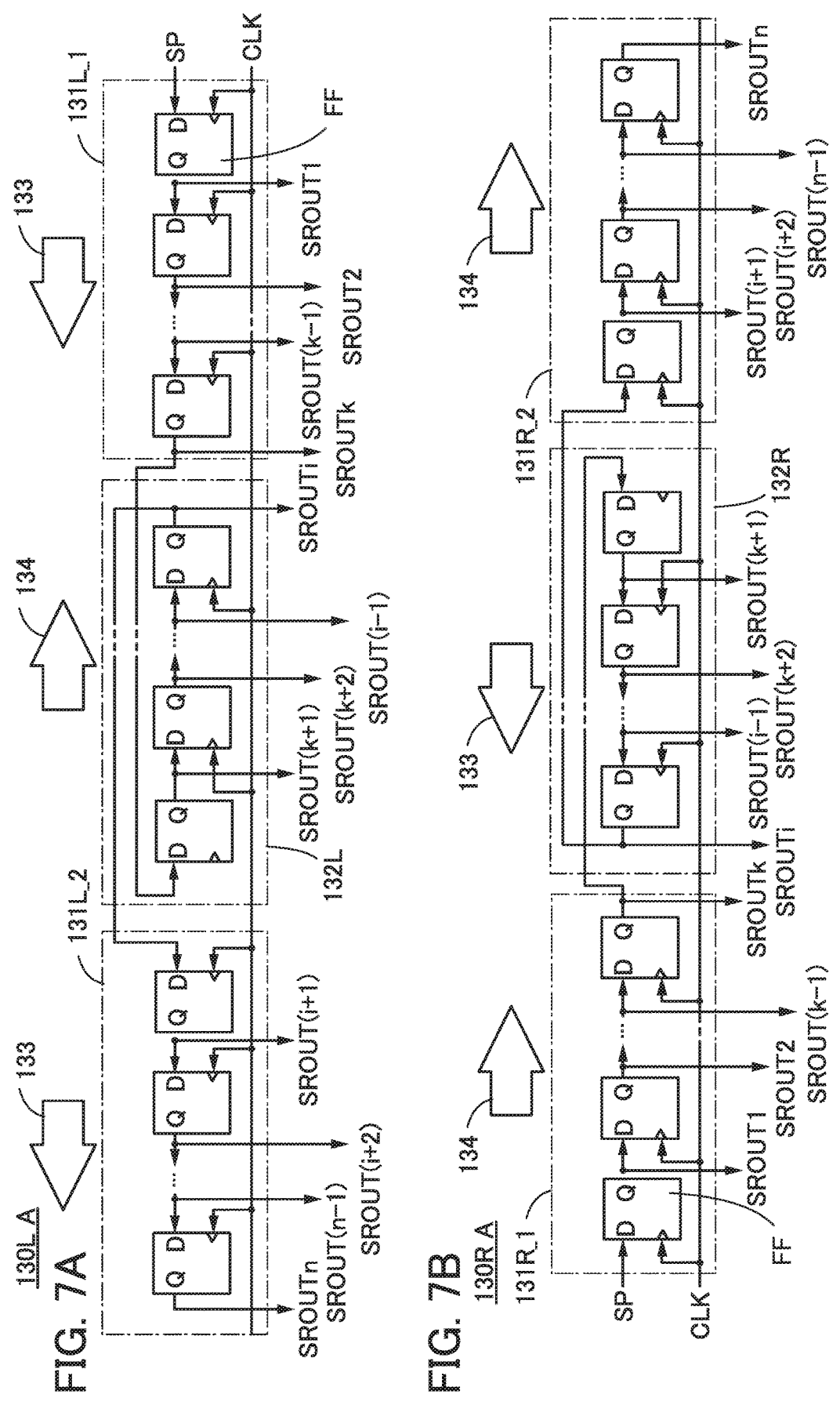

A structure different from the structures illustrated in FIG. 2A and FIG. 4A can also be employed. FIGS. 7A and 7B illustrate a structure different from those illustrated in FIG. 2A and FIG. 4A.

In FIG. 7A, a shift register 130L_A that can be used as the shift register 130 in FIG. 1 includes a plurality of pulse output circuits FFs.

The shift register 130L_A includes a circuit 131L_1, the circuit 132L, and a circuit 132L_2 in which a plurality of pulse output circuits FFs are provided. In the circuit 131L_1, a start pulse SP and a clock signal CLK are input, and pulse signals are output to output terminals SROUT1 to SROUTk sequentially. In the circuit 132L, the clock signal CLK and a pulse signal output from the output terminal SROUTk in the last stage of the circuit 131L_1 are input, and pulse signals are output to output terminals SROUT(k+1) to SROUTi sequentially. In the circuit 132L_2, the clock signal CLK and a pulse signal output from the output terminal SROUTi in the last stage of the circuit 132L are input, and pulse signals are output to output terminals SROUT(i+1) to SROUTn sequentially.

The circuit 131L_1 is capable of sequentially outputting pulse signals in the direction indicated by the arrow 133. That is, the pulse output circuits in the first to k-th stages, which are arranged in ascending order from right to left, output pulse signals in ascending order from right to left. The circuit 132L is capable of sequentially outputting pulse signals in the direction indicated by the arrow 134. That is, the pulse output circuits in the (k+1)-th to i-th stages, which are arranged in ascending order from left to right, output pulse signals in ascending order from left to right. The circuit 132L_2 is capable of sequentially outputting pulse signals in the direction indicated by the arrow 133. That is, the pulse output circuits in the (i+1)-th to n-th stages, which are arranged in ascending order from right to left, output pulse signals in ascending order from right to left.

In FIG. 7B, a shift register 130R_A that can be used as the shift register 130 in FIG. 1 includes a plurality of pulse output circuits FFs.

The shift register 130R_A includes a circuit 131R_1, the circuit 132R, and a circuit 132R_2 in which the plurality of pulse output circuits FFs are provided. In the circuit 131R_1, a start pulse SP and a clock signal CLK are input, and pulse signals are output to output terminals SROUT1 to SROUTk sequentially. In the circuit 132R, the clock signal CLK and a pulse signal output from the output terminal SROUTk in the last stage of the circuit 131R_1 are input, and pulse signals are output to output terminals SROUT(k+1) to SROUTi sequentially. In the circuit 132R_2, the clock signal CLK and a pulse signal output from the output terminal SROUTi in the last stage of the circuit 132R are input, and pulse signals are output to output terminals SROUT(i+1) to SROUTn sequentially.

The circuit 131R_1 is capable of sequentially outputting pulse signals in the direction opposite to that illustrated in FIG. 7A, i.e., the direction indicated by the arrow 134. That is, the pulse output circuits in the first to k-th stages, which are arranged in ascending order from left to right, output pulse signals in ascending order from left to right. The circuit 132R is capable of sequentially outputting pulse signals in the direction opposite to that illustrated in FIG. 7A, i.e., the direction indicated by the arrow 133. That is, the pulse output circuits in the (k+1)-th to i-th stages, which are arranged in ascending order from right to left, output pulse signals in ascending order from right to left. The circuit 132R_2 is capable of sequentially outputting pulse signals in the direction indicated by the arrow 134. That is, the pulse output circuits in the (i+1)-th to n-th stages, which are arranged in ascending order from left to right, output pulse signals in ascending order from left to right.

In one embodiment of the present invention, as described above, the number of output terminals can be increased without an increase in the size of a source driver. Thus, the frame of a display device including the source driver can be narrower. Furthermore, in one embodiment of the present invention, the direction in which pulse signals are sequentially output from a shift register in the source driver and the direction in which output terminals output video signals to source lines SL[1] to SL[n] sequentially can coincide with each other. Therefore, the frequency of intersection of the wirings in the source driver can be reduced, and a decrease in the degree of wiring congestion can be achieved. Since the degree of wiring congestion can be decreased and the number of output terminals can be increased, video signals can be output from a circuit configuration in which parasitic capacitance and parasitic resistance are reduced; thus, the display quality of the display device can be improved.

Embodiment 2

In this embodiment, an example of a circuit configuration of the shift register described in the above embodiment and an example of a circuit configuration of a pixel in the display portion described in the above embodiment will be described.

<Circuit Configuration of Shift Register>

Figure 8A:
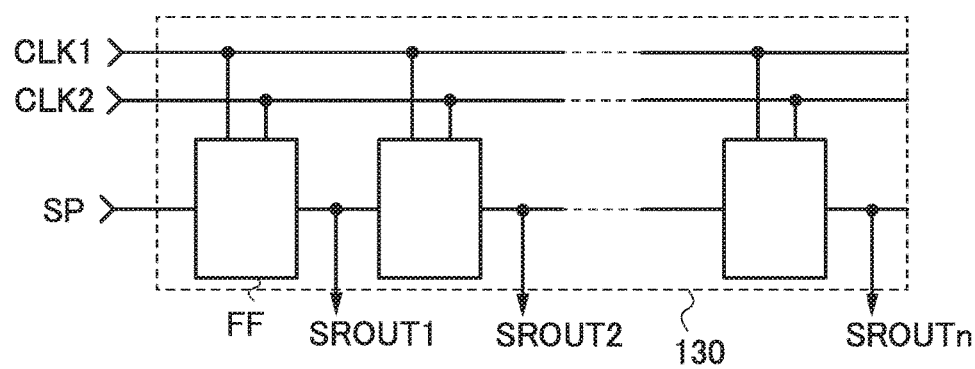
FIGS. 8A and 8B are circuit diagrams illustrating one embodiment of the present invention.
Figure 8B:
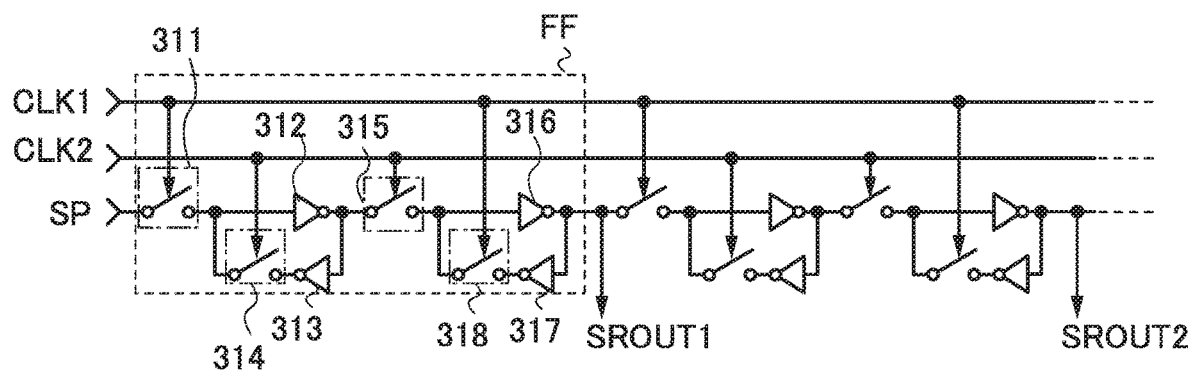

FIGS. 8A and 8B illustrate, as one example, a circuit configuration of a static shift register including a plurality of stages of pulse output circuits.

In the shift register illustrated in FIGS. 8A and 8B, a plurality of pulse output circuits FFs are connected in cascade. The plurality of stages of pulse output circuits FFs are connected to wirings through which a clock signal (CLK1) and a clock signal (CLK2) are transmitted. The pulse output circuit FF in the first stage is connected to a wiring through which a start pulse (SP) is transmitted. Output signals SROUT1 to SROUTn are output from the plurality of stages of pulse output circuits FFs.

The pulse output circuit FF includes, as illustrated in FIG. 8B, a switch 311, an inverter circuit 312, an inverter circuit 313, a switch 314, a switch 315, an inverter circuit 316, an inverter circuit 317, and a switch 318, for example. In the circuit diagram illustrated in FIG. 8B, a block indicated by the dashed line corresponds to the pulse output circuit FF of one stage.

The switches and the inverter circuits in the pulse output circuit FF may be formed using transistors having the same polarity, or may be formed using complementary transistors in combination. What is called a clocked inverter circuit in which switches and inverter circuits are used in combination may be employed.

<Circuit Configuration of Pixel>

Figure 9A:
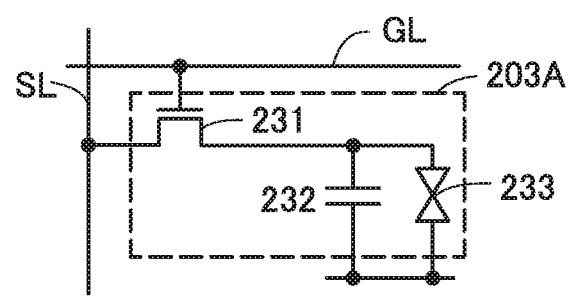
FIGS. 9A and 9B are each a circuit diagram illustrating one embodiment of the present invention.

A pixel 203A in FIG. 9A is an example of a pixel included in a liquid crystal display device and includes a transistor 231, a capacitor 232, and a liquid crystal element 233.

The transistor 231 serves as a switching element for controlling the connection between the liquid crystal element 233 and a source line SL. The on/off state of the transistor 231 is controlled by a scan signal input to its gate through a gate line GL.

The capacitor 232 is an element formed by stacking conductive layers, for example.

The liquid crystal element 233 includes a common electrode, a pixel electrode, and a liquid crystal layer, for example. Alignment of the liquid crystal material of the liquid crystal layer is changed by the action of an electric field generated between the common electrode and the pixel electrode.

Figure 9B:
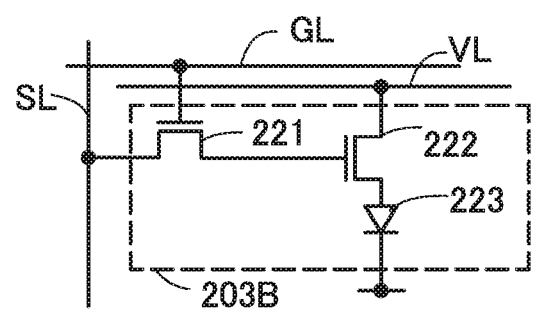

A pixel 203B in FIG. 9B is an example of a pixel included in an EL display device and includes a transistor 221, a transistor 222, and a light-emitting element 223. FIG. 9B illustrates a power supply line VL in addition to the gate line GL and the source line SL. The power supply line VL is a wiring for supplying current to the light-emitting element 223.

The transistor 221 serves as a switching element for controlling the connection between a gate of the transistor 222 and the source line SL. The on/off state of the transistor 221 is controlled by a scan signal input to its gate through the gate line GL.

The transistor 222 has a function of controlling current flowing between the power supply line VL and the light-emitting element 223, in accordance with voltage applied to the gate of the transistor 222.

The light-emitting element 223 is, for example, an element including a light-emitting layer provided between electrodes. The luminance of the light-emitting element 223 can be controlled by the amount of current that flows through the light-emitting layer.

Embodiment 3

In this embodiment, an example of a cross-sectional structure of a semiconductor device in one embodiment of the present invention will be described with reference FIG. 10.

In the semiconductor device described in the above embodiment, the circuits such as the shift register circuit can be formed using a transistor including silicon. As silicon, polycrystalline silicon, microcrystalline silicon, or amorphous silicon can be used. Note that an oxide semiconductor or the like can be used instead of silicon.

Figure 10:
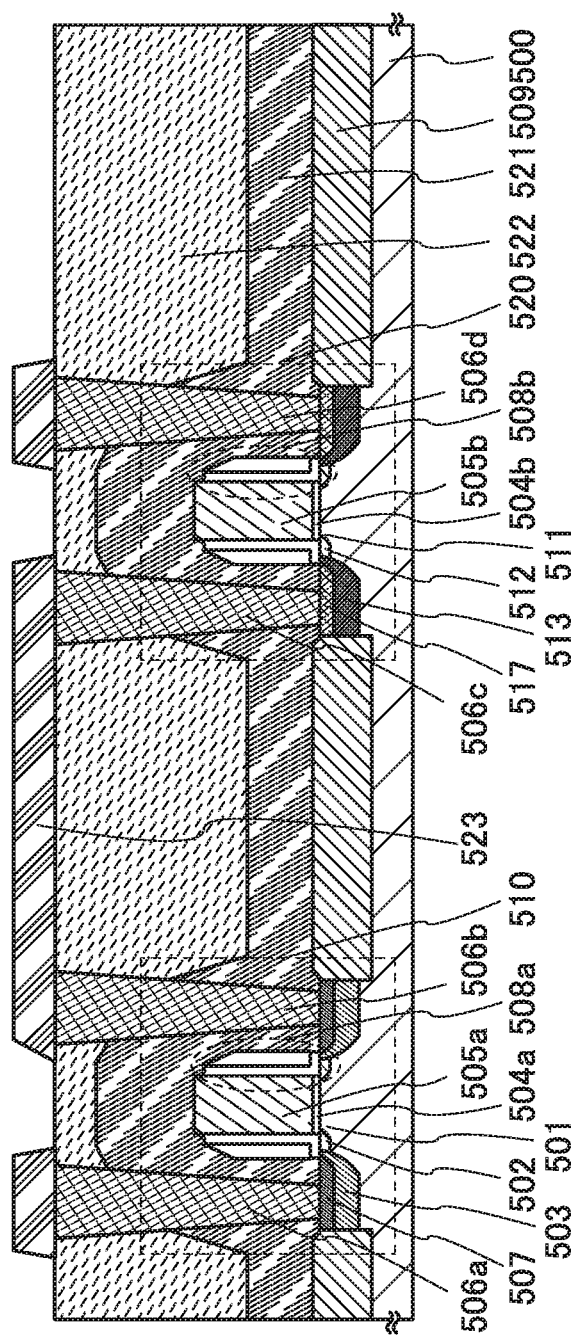
FIG. 10 is a cross-sectional view illustrating one embodiment of the present invention.

FIG. 10 is a schematic cross-sectional view of a semiconductor device of one embodiment of the present invention. The semiconductor device in the schematic cross-sectional view of FIG. 10 includes an n-channel transistor and a p-channel transistor that contain a semiconductor material (e.g., silicon).

An n-channel transistor 510 includes a channel formation region 501 in a substrate 500 containing a semiconductor material, low-concentration impurity regions 502 and high-concentration impurity regions 503 (collectively referred to simply as impurity regions in some cases) with the channel formation region 501 placed between the impurity regions, intermetallic compound regions 507 in contact with the impurity regions, a gate insulating film 504a over the channel formation region 501, a gate electrode layer 505a over the gate insulating film 504a, and a source electrode layer 506a and a drain electrode layer 506b in contact with the intermetallic compound regions 507. A sidewall insulating film 508a is provided on a side surface of the gate electrode layer 505a. An interlayer insulating film 521 and an interlayer insulating film 522 are provided to cover the transistor 510. The source electrode layer 506a and the drain electrode layer 506b are connected to the intermetallic compound regions 507 through openings formed in the interlayer insulating films 521 and 522.

A p-channel transistor 520 includes a channel formation region 511 in the substrate 500 containing the semiconductor material, low-concentration impurity regions 512 and high-concentration impurity regions 513 (collectively referred to simply as impurity regions in some cases) with the channel formation region 511 placed between the impurity regions, intermetallic compound regions 517 in contact with the impurity regions, a gate insulating film 504b over the channel formation region 511, a gate electrode layer 505b over the gate insulating film 504b, and a source electrode layer 506c and a drain electrode layer 506d in contact with the intermetallic compound regions 517. A sidewall insulating film 508b is provided on a side surface of the gate electrode layer 505b. The interlayer insulating films 521 and 522 are provided to cover the transistor 520. The source electrode layer 506c and the drain electrode layer 506d are connected to the intermetallic compound regions 517 through openings formed in the interlayer insulating films 521 and 522.

An element isolation insulating film 509 is provided in the substrate 500 to surround the transistors 510 and 520.

Although FIG. 10 shows the case where the channels of the transistors 510 and 520 are formed in the semiconductor substrate, the channels of the transistors 510 and 520 may be formed in an amorphous semiconductor film or a polycrystalline semiconductor film formed over an insulating surface. Alternatively, the channels of the transistors may be formed in a single crystal semiconductor film, as in the case of using an SOI substrate.

When the transistors 510 and 520 are formed using a single crystal semiconductor substrate, the transistors 510 and 520 can operate at high speed. Accordingly, a single crystal semiconductor substrate is preferably used for transistors that form the circuits described in the above embodiment.

The transistor 510 is connected to the transistor 520 through a wiring 523. It is possible to employ a structure where an interlayer insulating film and an electrode layer are provided over the wiring 523 and another transistor is stacked over them.

Embodiment 4

In this embodiment, application examples of the semiconductor device described in the above embodiment to a display device and a touch panel, a structural example of a block diagram of the touch panel, and examples of application to electronic devices will be described with reference to FIGS. 11A and 11B, FIG. 12, FIG. 13, FIG. 14, FIGS. 15A to 15C, and FIGS. 16A to 16E.

Mounting Example on Display Device

An example of mounting the semiconductor device on a display panel will be described with reference to FIGS. 11A and 11B.

Figure 11A:
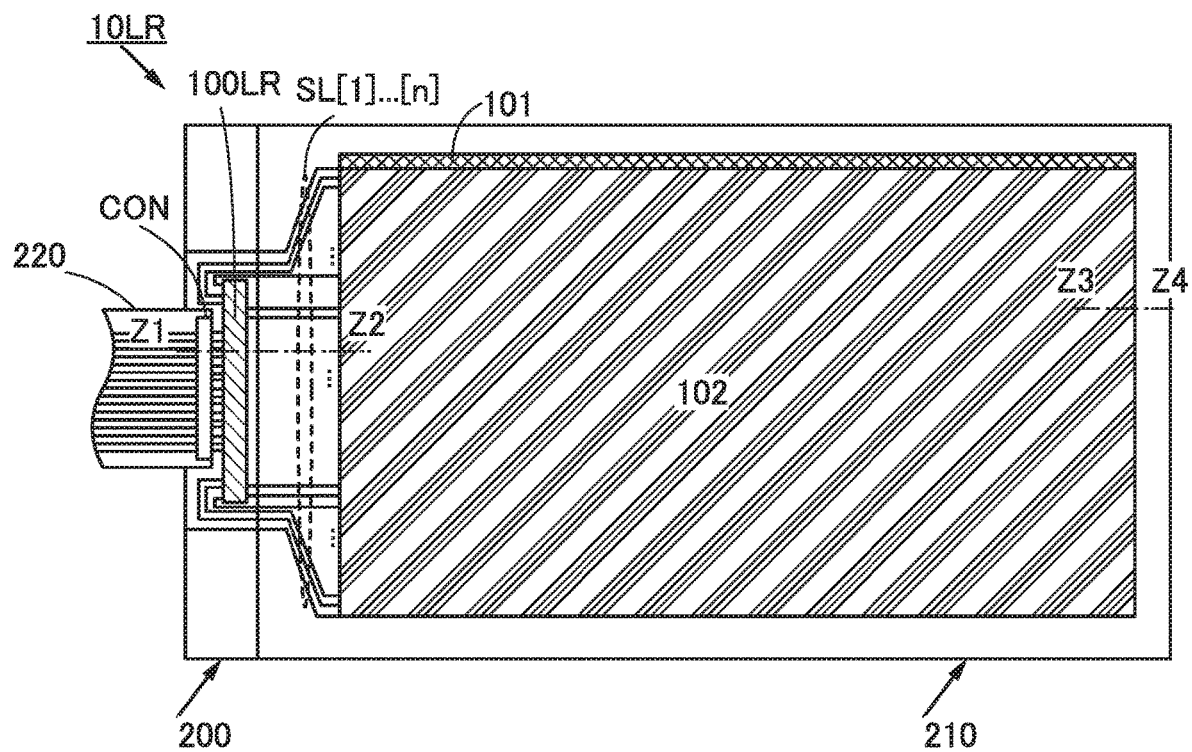
FIGS. 11A and 11B are a top view and a cross-sectional view illustrating one embodiment of the present invention.

FIG. 11A is a top view of the display device illustrated in FIG. 6A. FIG. 11B is a cross-sectional view of the display device 10LR taken along the lines Z1-Z2 and Z3-Z4 of FIG. 11A. In the display device illustrated in FIG. 11B, a light-emitting element is used as a display element included in the display portion. However, the display element may be a liquid crystal element including a liquid crystal layer between electrodes.

A terminal portion 700 in the cross section taken along the line Z1-Z2 includes a terminal portion 710, a terminal portion 720, the connection portion CON, and the like. The terminal portions 710 and 720 are connected to the source driver 100LR, and the connection portion CON is connected to the FPC 220 through a connection layer 702.

The connection portion CON is connected to an input terminal of the source driver 100LR through the connection layer 702 and a contact 704. Through a connection layer 703, the contact 704, and a contact 705, an output terminal of the source driver 100LR is connected to a conductive layer that is connected to the display portion 102.

The display portion 102 in the cross section taken along the line Z3-Z4 includes a plurality of pixels. For example, each of the pixels includes a transistor 731 and a light-emitting element 732 which are provided between the substrate 200 and the substrate 210. The pixel may further include a touch sensor (not illustrated), a sealant 733, and the like between the substrate 200 and the substrate 210.

<Components>

The components illustrated in FIG. 11B will be described below.

<<Connection Layers and Contacts>>

The connection layers 702 and 703 and the contacts 704 and 705 can be formed using any of various kinds of anisotropic conductive films (ACF), anisotropic conductive pastes (ACP), and the like.

<<Substrates>>

As each of the substrates 200 and 210, a substrate having a flat surface can be used. The substrate through which light emitted from the display element is extracted is formed using a material that transmits the light. For example, a material such as glass, quartz, ceramics, sapphire, or an organic resin can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used.

Still alternatively, any of these substrates provided with a semiconductor element may be used as the substrate. Alternatively, a flexible substrate may be used as the substrate, and a transistor, a capacitor, or the like may be provided directly over the flexible substrate.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

<<Transistor>>

A transistor that can be used as the transistor 731 or the like includes a conductive layer functioning as a gate electrode, a semiconductor layer, a conductive layer functioning as a source electrode, a conductive layer functioning as a drain electrode, and an insulating layer functioning as a gate insulating layer. In the above example, a bottom-gate transistor is used.

Note that there is no particular limitation on the structure of the transistor. For example, a planar transistor, a staggered transistor, or an inverted staggered transistor may be used. A top-gate transistor or a bottom-gate transistor may be used. Gate electrodes may be provided above and below a channel. There is no particular limitation on a semiconductor material used for the transistor, and an oxide semiconductor, silicon, or germanium can be used, for example.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

As a semiconductor material for the semiconductor layer of the transistor, an element of Group 14, a compound semiconductor, or an oxide semiconductor can be used, for example. Typically, a semiconductor containing silicon, a semiconductor containing gallium arsenide, an oxide semiconductor containing indium, or the like can be used.

An oxide semiconductor is preferably used as a semiconductor in which a channel of the transistor is formed. In particular, an oxide semiconductor having a wider band gap than silicon is preferably used. A semiconductor material having a wider band gap and a lower carrier density than silicon is preferably used because the off-state current of the transistor can be reduced.

For example, the oxide semiconductor preferably contains at least indium (In) or zinc (Zn). The oxide semiconductor more preferably includes an In-M-Zn oxide (M is a metal such as Al, Ti, Ga, Ge, Y, Zr, Sn, La, Ce, Hf, or Nd).

Alternatively, silicon is preferably used as a semiconductor in which a channel of the transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even in the case where pixels are provided at extremely high resolution, a gate driver circuit and a source driver circuit can be formed over a substrate over which the pixels are formed, and the number of components of an electronic device can be reduced.

<<Conductive Layers>>

As conductive layers such as a gate, a source, and a drain of the transistor and wirings and electrodes, a single-layer structure or a stacked-layer structure using any of metals such as aluminum, titanium, chromium, nickel, copper, yttrium, zirconium, molybdenum, silver, tantalum, and tungsten, or an alloy containing any of these metals as its main component can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may also be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to transmit light. Alternatively, a stack of any of the above materials can be used as the conductive layer. For example, a stacked film of indium tin oxide and an alloy of silver and magnesium is preferably used because the conductivity can be increased. These can be used also for conductive layers such as wirings and electrodes included in the touch panel and for electrodes (such as a pixel electrode and a common electrode) included in the display element.

Alternatively, for the conductive layer, an oxide semiconductor similar to that of the semiconductor layer is preferably used. In that case, it is preferable that the conductive layer be formed to have a lower electric resistance than a region in the semiconductor layer where a channel is formed.

For example, such a conductive layer can be used as the conductive layer functioning as the second gate electrode of the transistor. Alternatively, it can be used as another light-transmitting conductive layer.

<<Insulating Layers>>

Examples of an insulating material that can be used for the insulating layers, an overcoat, a spacer, and the like include a resin such as an acrylic resin or an epoxy resin, a resin having a siloxane bond, and an inorganic insulating material such as silicon oxide, silicon oxynitride, silicon nitride oxide, silicon nitride, or aluminum oxide.

<<Light-Emitting Element>>

As a light-emitting element that can be used as the light-emitting element 732 or the like, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may be a top-emission, bottom-emission, or dual-emission light-emitting element. A conductive film that transmits visible light is used as an electrode through which light is extracted. A conductive film that reflects visible light is preferably used as an electrode through which light is not extracted.

The EL layer provided an anode and a cathodes includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer, and an inorganic compound may also be used. The layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between the anode and the cathode, holes are injected to the EL layer from the anode side and electrons are injected to the EL layer from the cathode side. The injected electrons and holes are recombined in the EL layer, so that a light-emitting substance contained in the EL layer emits light.

In the case where a light-emitting element emitting white light is used as the light-emitting element, the EL layer preferably contains two or more kinds of light-emitting substances. For example, light-emitting substances are selected so that two or more light-emitting substances emit light of complementary colors to obtain white light emission. Specifically, it is preferable to contain two or more light-emitting substances selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., greater than or equal to 350 nm and less than or equal to 750 nm). An emission spectrum of a material emitting light having a peak in the wavelength range of yellow light preferably includes spectral components also in the wavelength ranges of green light and red light.

More preferably, a light-emitting layer containing a light-emitting material emitting light of one color and a light-emitting layer containing a light-emitting material emitting light of another color are stacked in the EL layer. For example, the plurality of light-emitting layers in the EL layer may be stacked in contact with each other or may be stacked with a separation layer provided therebetween. For example, a separation layer may be provided between a fluorescent layer and a phosphorescent layer.

The separation layer can be provided, for example, to prevent energy transfer by the Dexter mechanism (particularly, triplet energy transfer) from a phosphorescent material or the like in an excited state which is generated in the phosphorescent layer to a fluorescent material or the like in the fluorescent layer. The thickness of the separation layer may be several nanometers. Specifically, the thickness of the separation layer is greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in the light-emitting layer in contact with the separation layer. This facilitates the manufacture of the light-emitting element and reduces the drive voltage. For example, in the case where the phosphorescent layer contains a host material, an assist material, and the phosphorescent material (a guest material), the separation layer may contain the host material and the assist material. In other words, the separation layer includes a region that does not contain the phosphorescent material, and the phosphorescent layer includes a region that contains the phosphorescent material in the above structure. Accordingly, the separation layer and the phosphorescent layer can be evaporated separately depending on whether the phosphorescent material is contained or not. With such a structure, the separation layer and the phosphorescent layer can be formed in the same chamber. Thus, the manufacturing cost can be reduced.

The light-emitting element may be a single element including one EL layer or a tandem element in which a plurality of EL layers are stacked with a charge generation layer provided therebetween.

Figure 11B:
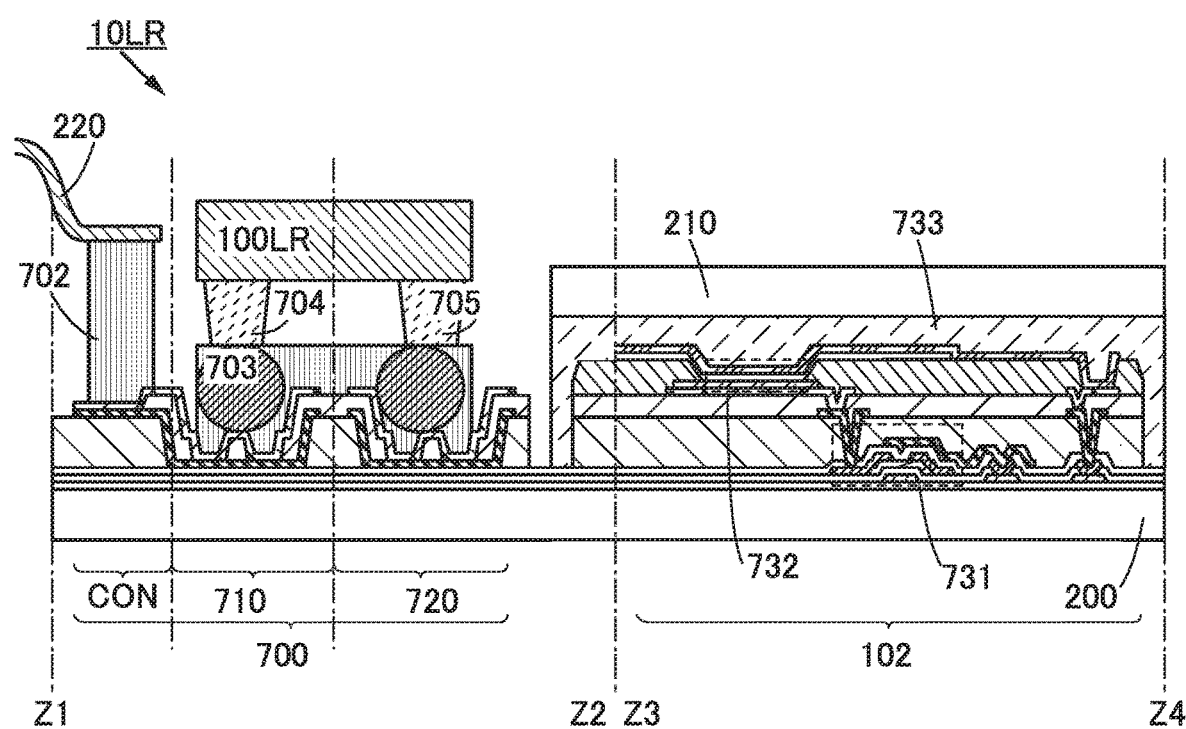

Note that the light-emitting element 732 is illustrated as one example in FIG. 11B; however, display elements other than the light-emitting element 732 can also be used. For example, display elements (electronic ink) that perform display by an electrophoretic method, an electronic liquid powder (registered trademark) method, an electrowetting method, or the like, MEMS shutter display elements, optical interference type MEMS display elements, and liquid crystal elements can be used.

<<Sealant>>

A sealant that can be used as the sealant 733 has a function of attaching substrates to each other. The sealant has a higher refractive index than the air. In the case where light is extracted to the sealant side, the sealant preferably also serves as an optical adhesive layer.

Application Example of Display Device

Next, an application example of a display module using the display device illustrated in FIGS. 11A and 11B will be described with reference to FIG. 12.

Figure 12:
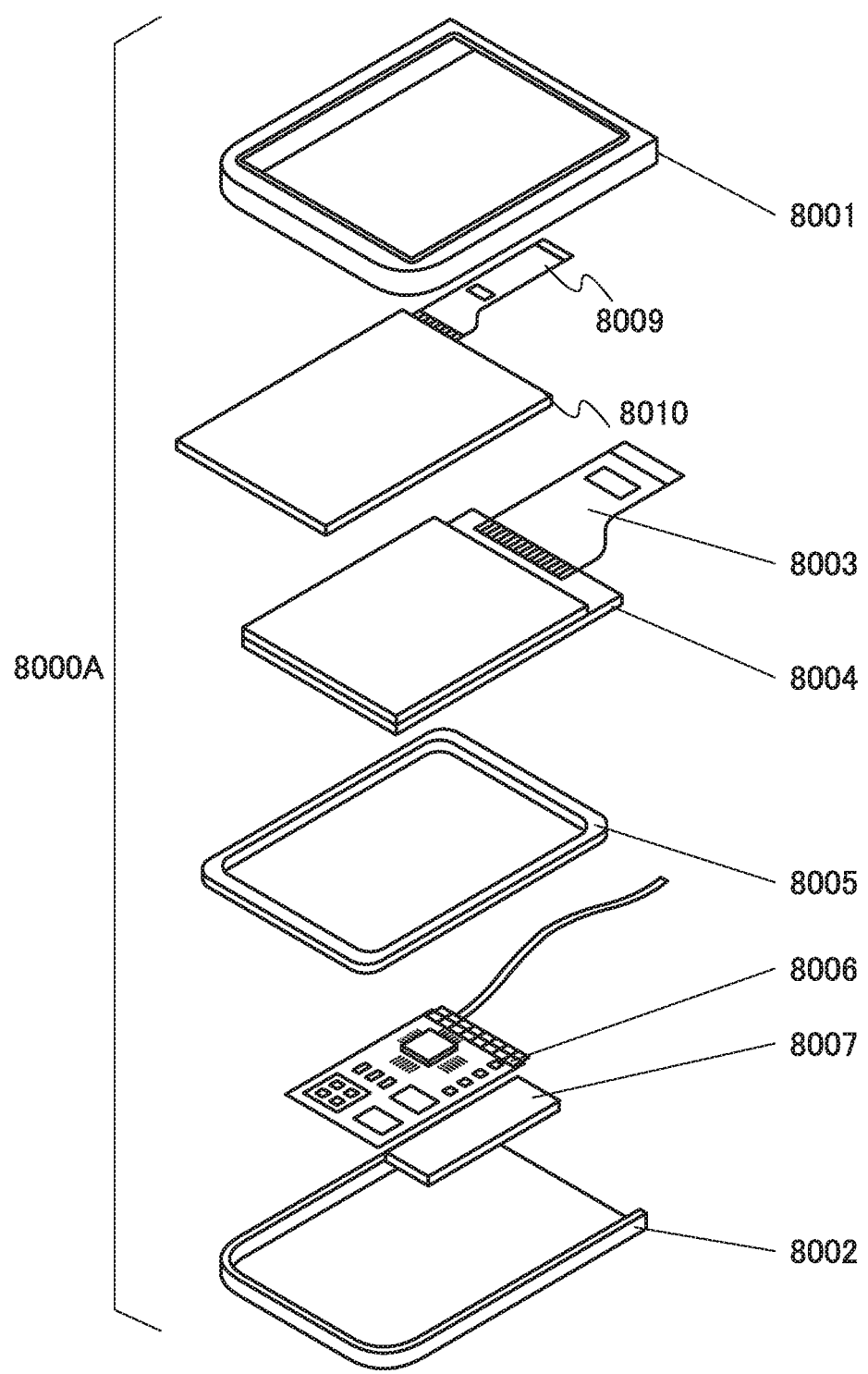
FIG. 12 is a perspective view illustrating one embodiment of the present invention.

In a display module 8000A illustrated in FIG. 12, a touch sensor 8010 connected to an FPC 8009, a display device

8004 connected to an FPC 8003, a frame 8005, a printed board 8006, and a battery 8007 are provided between an upper cover 8001 and a lower cover 8002. In the case where a display element in the display device 8004 is a liquid crystal element, a backlight unit or the like may also be provided.

Like the display module 8000A illustrated in FIG. 12, a display module in which an electrode of a touch sensor is incorporated separately from a display device is also called an out-cell touch panel (or a display device with an out-cell touch sensor) in some cases.

A touch panel refers to a display device (or a display module) provided with a touch sensor. In some cases, a touch panel is called a touch screen. Furthermore, a device which does not include a display device and includes only a touch sensor is called a touch panel in some cases. A display device that is provided with a touch sensor is also called a touch sensor equipped display device, a display device equipped touch panel, a display module, or the like in some cases.

A display device in which an electrode of a touch sensor is incorporated on the element substrate side is called a full in-cell touch panel (or a full in-cell touch sensor equipped display device), in some cases. In the full in-cell touch panel, for example, an electrode formed on the element substrate side is also used as an electrode for the touch sensor.

A display device in which an electrode of a touch sensor is incorporated on the counter substrate side as well as on the element substrate side is called a hybrid in-cell touch panel (or a hybrid in-cell touch sensor equipped display device). The hybrid in-cell touch panel uses an electrode formed on the element substrate side and an electrode formed on the counter substrate side as electrodes for a touch sensor, for example.

A display device in which an electrode of a touch sensor is incorporated on the counter substrate side is called an on-cell touch panel (or an on-cell touch sensor equipped display device), in some cases. The on-cell touch panel uses an electrode formed on the counter substrate side also as an electrode for a touch sensor, for example.

Figure 13:
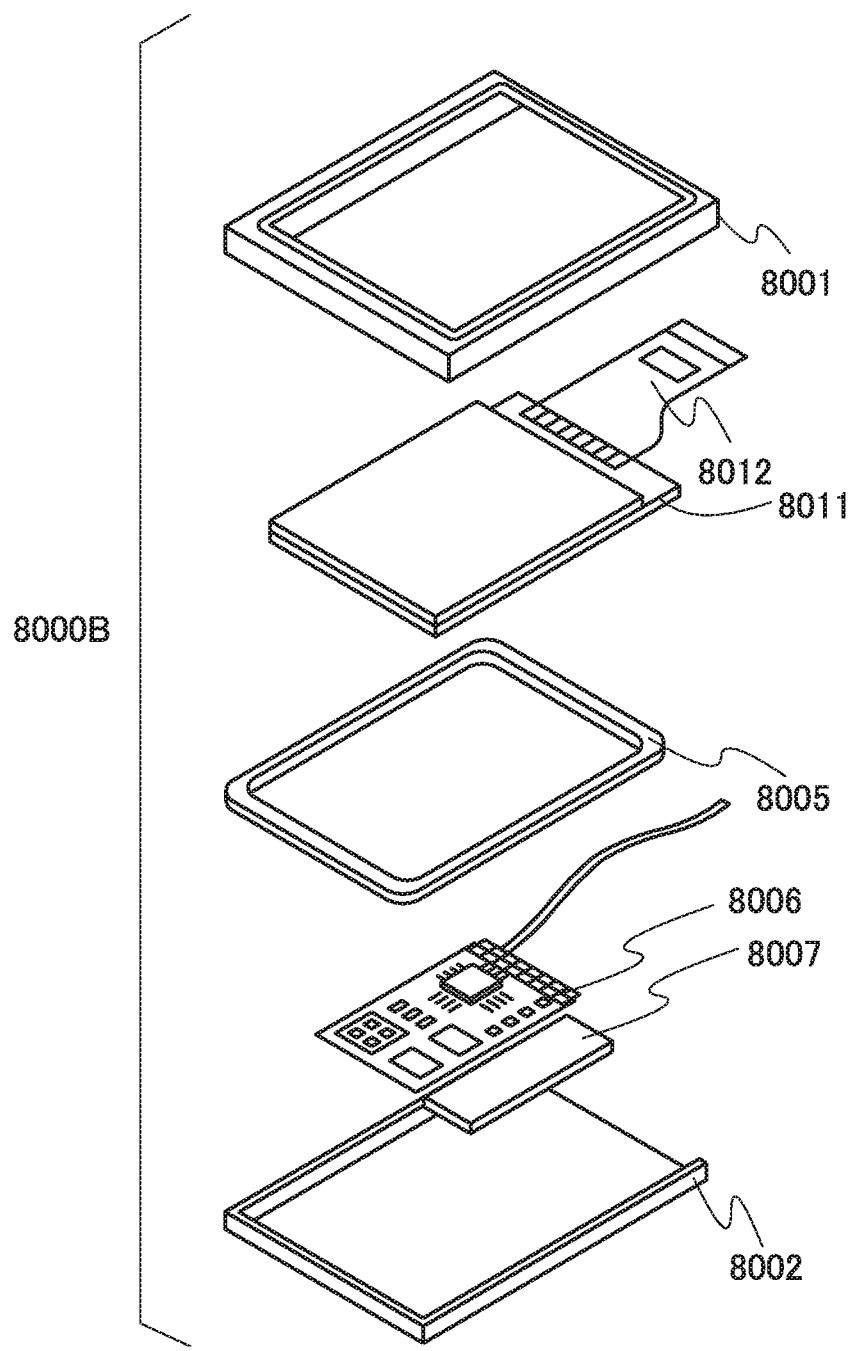
FIG. 13 is a perspective view illustrating one embodiment of the present invention.

FIG. 13 illustrates a display module 8000B including a touch panel in which a display device has a touch sensor function, like the above full in-cell, hybrid in-cell, or on-cell touch panel. In the display module 8000B, a touch panel 8011 connected to an FPC 8012, a frame 8005, a printed board 8006, and a battery 8007 are provided between an upper cover 8001 and a lower cover 8002. In the case where a display element in the touch panel 8011 is a liquid crystal element, a backlight unit or the like may also be provided.

The semiconductor device described in the above embodiment can be used for the display device 8004 in FIG. 12 or the touch panel 8011 in FIG. 13. Accordingly, the frames of the display modules 8000A and 8000B can be narrower, and the image qualities thereof can be improved.

The shapes and sizes of the upper cover 8001 and the lower cover 8002 can be changed as appropriate in accordance with the size of the display device 8004, the touch panel 8011, or the like.

For the touch sensor 8010 and the touch panel 8011, a resistive or capacitive touch sensor can be used.

The frame 8005 protects the display device 8004, the touch panel 8011, or the like and functions as an electromagnetic shield for blocking electromagnetic waves generated by the operation of the printed board 8006. The frame 8005 can also function as a radiator plate.

The printed board 8006 includes circuits for outputting a variety of signals for driving the display device 8004, the touch panel 8011, or the like. As a power source for supplying power to the circuits on the printed board 8006, an external commercial power source or a power source using the battery 8007 provided separately may be used. The battery 8007 can be omitted in the case of using a commercial power source.

Each of the display modules 8000A and 8000B can be additionally provided with a component such as a polarizing plate, a retardation plate, or a prism sheet.

Structural Example of Block Diagram of Touch Panel

A structural example of a block diagram of a touch panel in which a display device including a semiconductor device has a touch sensor function will be described below.

Figure 14:
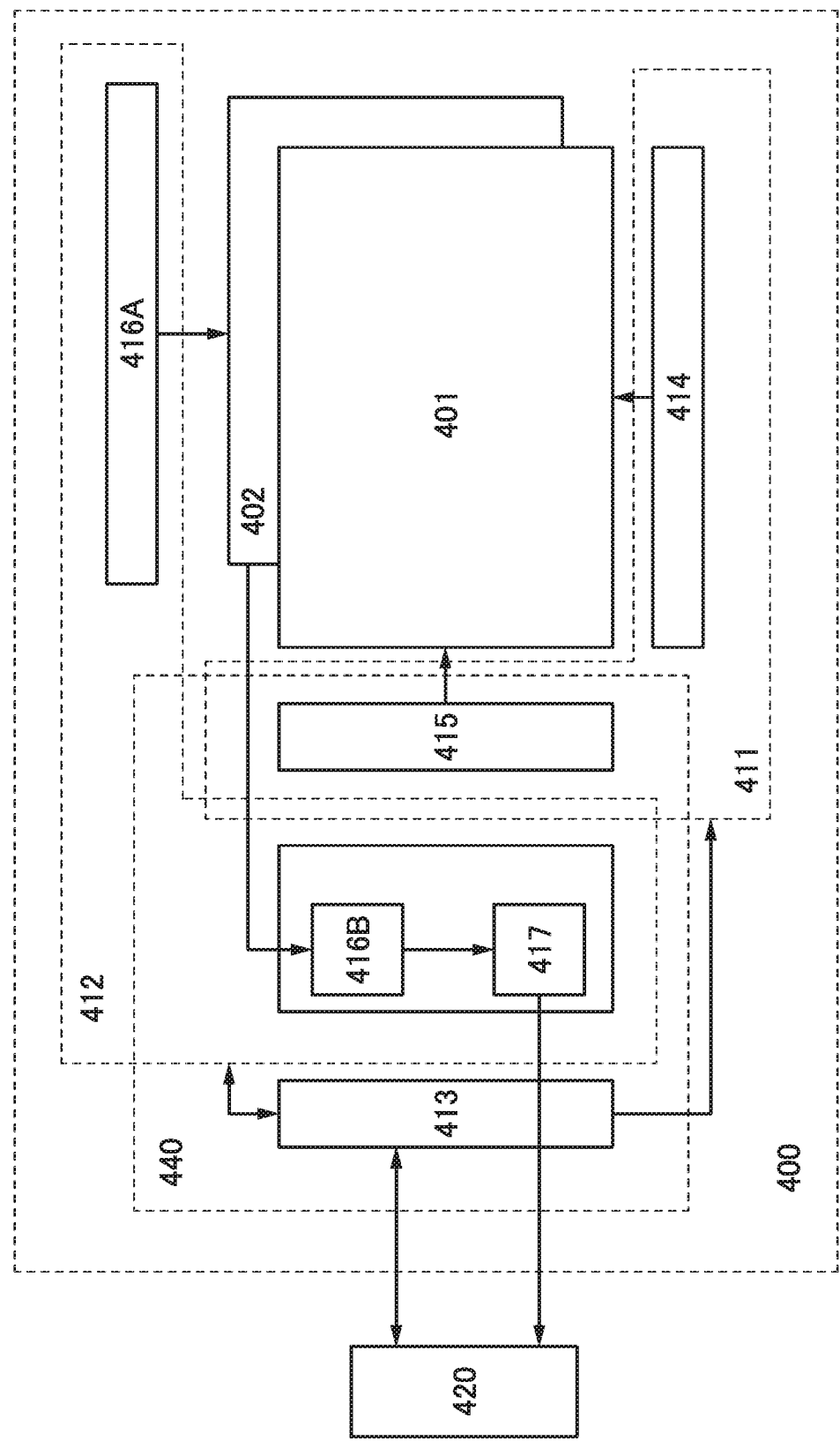
FIG. 14 is a block diagram illustrating one embodiment of the present invention.

FIG. 14 is a block diagram of a full in-cell, hybrid in-cell, or on-cell touch panel and its peripheral circuits. A touch panel 400 includes a display portion 401 and a touch sensor portion 402. Furthermore, the touch panel 400 includes, as examples of peripheral circuits for driving the display portion 401 and the touch sensor portion 402, a display driver circuit 411, a touch sensor driver circuit 412, and a timing controller 413. As another peripheral circuit, a power supply circuit or the like for generating a power supply voltage needed for the display portion 401 and the touch sensor portion 402 may also be provided.

The display driver circuit 411 includes a scan line driver circuit 414 and a signal line driver circuit 415, for example. The scan line driver circuit 414 and the signal line driver circuit 415 are capable of controlling display by sequentially driving pixels (not illustrated) provided in a matrix in the display portion 401.

The signal line driver circuit 415 corresponds to the driver IC, which is described in the above embodiment. As described in the above embodiment, the number of output terminals of the driver IC can be increased without an increase in the degree of wiring congestion. Therefore, even a small driver IC can drive a high-definition display device.

In the case where the number of pixels or the frame frequency is increased, two or more scan line driver circuits 414 and signal line driver circuits 415 may be provided and the pixels may be divided into a plurality of display regions to be controlled on a region basis. With such a structure, the definition of a displayed image, the signal writing speed, or the like can be higher.

The touch sensor driver circuit 412 includes analog circuits 416A and 416B and a digital signal processing circuit 417, for example. The analog circuits 416A and 416B mainly process an analog signal. The digital signal processing circuit 417 mainly processes a digital signal.

The analog circuit 416A has a function of applying a pulse voltage to the drive electrode (Tx) side of the touch sensor portion 402, for example. As the analog circuit 416A, a level shifter circuit, a buffer circuit, or the like can be used.

The analog circuit 416B has a function of, for example, receiving an analog signal from the detection electrode (Rx) side of the touch sensor portion 402 and converting it into a digital signal. As the analog circuit 416B, an integrator circuit, a sample-and-hold circuit, an analog/digital (A/D) converter, or the like can be used.

The digital signal processing circuit 417 is a circuit that performs signal processing such as noise removal from a digital signal output from the analog circuit 416B, detection of a touch position, and tracking of the touch position, for example. As the digital signal processing circuit 417, a circuit only for signal processing, such as an application specific integrated circuit (ASIC) or a field programmable gate array (FPGA), can be used. Data that can be obtained by signal processing in the digital signal processing circuit 417 can be output to a host controller 420 that is positioned outside the touch panel 400.

The timing controller 413 is, for example, a circuit that receives an image signal or the like from the host controller 420 and generates a signal for controlling the display driver circuit 411, such as a clock signal, a vertical synchronization signal, or a horizontal synchronization signal. Furthermore, the timing controller 413 is, for example, a circuit that receives a signal from the host controller 420 and generates a signal for controlling the touch sensor driver circuit 412.

Note that a variety of signals received from the outside host controller 420 can be input to the timing controller 413 through an interface such as a digital visual interface (DVI), a low voltage differential signaling (LVDS), or a reduced swing differential signaling (RSDS).

The host controller 420 is a circuit for receiving and sending a variety of signals from/to the peripheral circuits of the touch panel. For example, the host controller 420 includes an arithmetic circuit or a frame memory, and receives and sends signals from/to the touch panel 400 or another device.

When some circuits of the display driver circuit 411, the touch sensor driver circuit 412, and the timing controller 413 described above are formed using an integrated circuit (IC) that is formed on a silicon substrate, they can be provided over a substrate where the touch panel 400 is provided, an FPC connected to the substrate where the touch panel 400 is provided, or the like. Therefore, in the block of the touch panel 400 in FIG. 14, an IC 440 includes the signal line driver circuit 415, the analog circuit 416B, the digital signal processing circuit 417, and the timing controller 413.

When an IC has a function of driving the display portion 401 and a function of driving the touch sensor portion 402 as described above, the number of ICs mounted on the touch panel 400 can be reduced; accordingly, cost can be reduced. Furthermore, as in the case of the signal line driver circuit 415 described above, the number of output terminals of the IC 440 including the signal line driver circuit 415 can be increased without an increase in the degree of wiring congestion. Therefore, even a small IC can drive a high-definition display device.

Figure 15A:
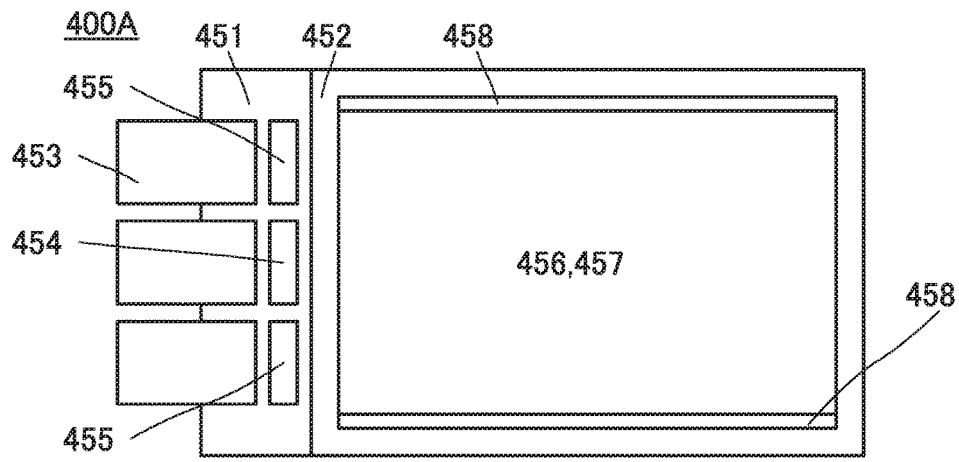
FIGS. 15A to 15C are each a schematic diagram illustrating one embodiment of the present invention.
Figure 15B:
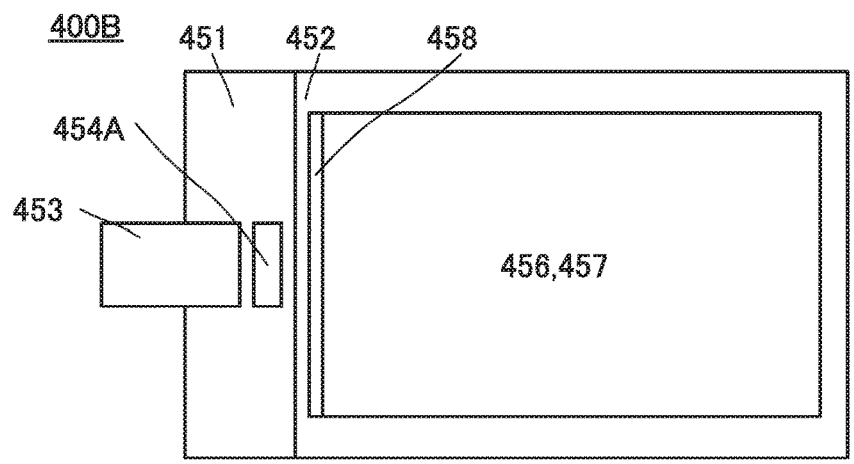
Figure 15C:
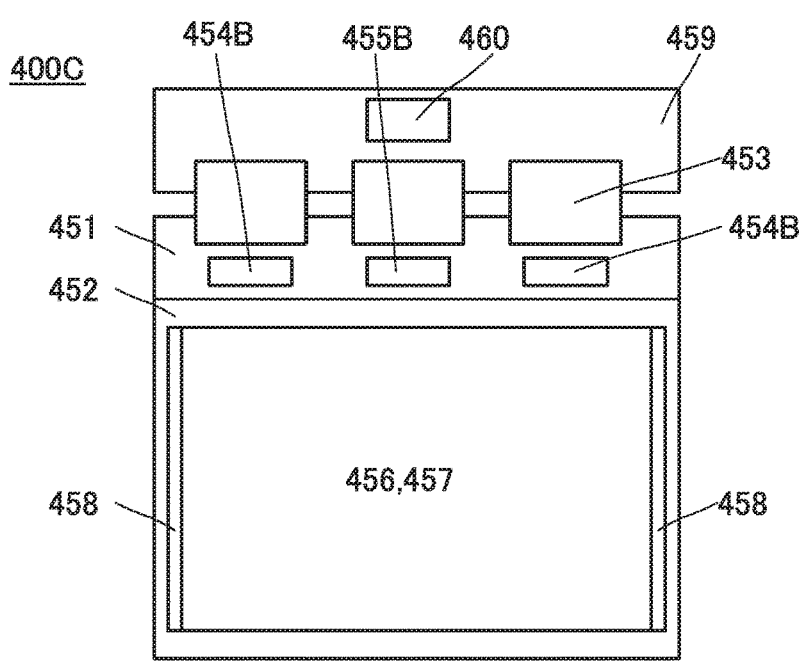

FIGS. 15A to 15C are each a schematic diagram illustrating an example of mounting an IC on a touch panel.

In FIG. 15A, a touch panel module 400A includes a substrate 451, a counter substrate 452, a plurality of FPCs 453, an IC 454, ICs 455, and the like. A display portion 456, a touch sensor portion 457, and scan line driver circuits 458 are provided between the substrate 451 and the counter substrate 452. The IC 454 and the ICs 455 are mounted on the substrate 451 by a chip on glass (COG) method or the like.

The IC 454 includes a circuit functioning as the signal line driver circuit 415 in the IC 440 illustrated in FIG. 14. The IC 454 further includes circuits functioning as the analog circuit 416B, the digital signal processing circuit 417, and the timing controller 413 in the IC 440 illustrated in FIG. 14. The IC 454 and the ICs 455 are supplied with signals from the outside through the FPCs 453. Furthermore, signals can be output to the outside from the IC 454 and the ICs 455 through the FPCs 453.

FIG. 15A illustrates an example where the display portion 456 is positioned between two scan line driver circuits 458. The ICs 455 are provided in addition to the IC 454. Such a structure is preferable in the case where pixels are arranged with high density in the display portion 456.

FIG. 15B illustrates an example where one IC 454A and one FPC 453 are mounted on a touch panel module 400B. The IC 454A includes circuits functioning as the signal line driver circuit 415, the analog circuit 416B, the digital signal processing circuit 417, and the timing controller 413 in the IC 440 illustrated in FIG. 14. It is preferable to bring functions into one IC 454A in this manner because the number of components can be reduced. In the example of FIG. 15B, the scan line driver circuit 458 is provided along a side on the FPC 453 side of two short sides of the display portion 456.

FIG. 15C illustrates an example where a touch panel module 400C includes a printed circuit board (PCB) 459 on which an IC 460 having some functions of the ICs 454 and 454A illustrated in FIGS. 15A and 15B or the like is mounted. ICs 454B and an IC 455B on the substrate 451 are electrically connected to the PCB 459 through the FPCs 453.

In FIGS. 15A to 15C, the ICs 454, 454A, 454B, 455, and 455B may be mounted on the FPC 453, not on the substrate 451. For example, the ICs 454, 454A, 454B, 455, and 455B may be mounted on the FPC 453 by a chip on film (COF) method, a tape automated bonding (TAB) method, or the like.

A structure where the FPC 453 and the ICs 454 and 454A are provided on a short side of the display portion 456 as illustrated in FIGS. 15A and 15B enables the frame of the display device to be narrowed; thus, the structure is preferably used for electronic devices such as smartphones, mobile phones, and tablet terminals, for example. The structure with the PCB 459 illustrated in FIG. 15C can be preferably used for television devices, monitors, tablet terminals, or laptop personal computers, for example.

Examples of Application to Electronic Devices

Next, an electronic device having a display panel including the above display module will be described. Examples of the electronic device include a computer, a portable information terminal (including a mobile phone, a portable game machine, and an audio reproducing device), electronic paper, a television device (also referred to as television or television receiver), and a digital video camera.

Figure 16A:
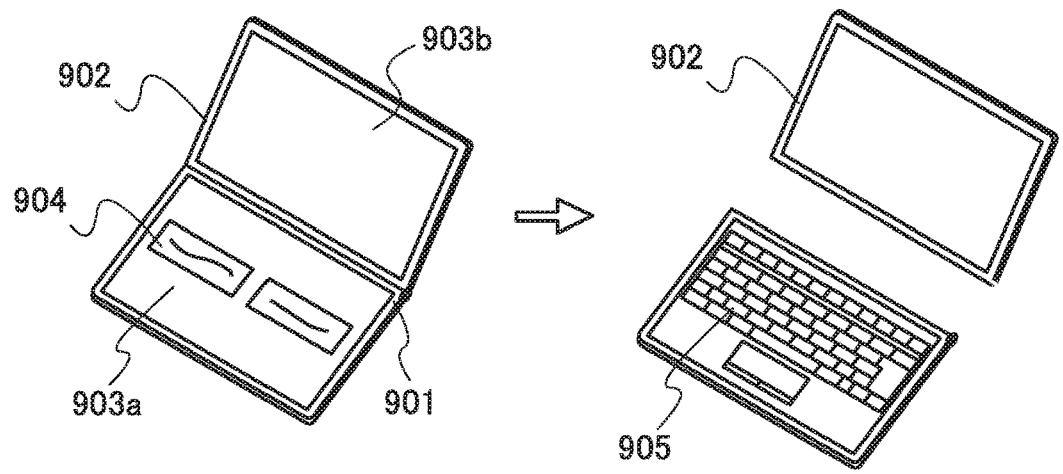
FIGS. 16A to 16E each illustrate one embodiment of the present invention.

FIG. 16A illustrates a portable information terminal, which includes a housing 901, a housing 902, a first display portion 903a, a second display portion 903b, and the like. At least one of the housings 901 and 902 is provided with a display module including the semiconductor device described in the above embodiment. Thus, a portable information terminal with a narrower frame and improved display quality can be obtained.

The first display portion 903a is a panel having a touch input function, and for example, as illustrated in the left of FIG. 16A, which of "touch input" and "keyboard input" is performed can be selected by a selection button 904 displayed on the first display portion 903a. Since selection buttons with a variety of sizes can be displayed, the portable information terminal can be easily used by people of any generation. For example, when "keyboard input" is selected, a keyboard 905 is displayed on the first display portion 903a as illustrated in the right of FIG. 16A. Thus, letters can be input quickly by keyboard input as in a conventional information terminal, for example.

One of the first display portion 903a and the second display portion 903b can be detached from the portable information terminal as illustrated in the right of FIG. 16A.

Providing the second display portion 903b with a touch input function makes the portable information terminal convenient to carry because a weight to carry around can be further reduced and the portable information terminal can operate with one hand while the other hand supports the housing 902.

The portable information terminal in FIG. 16A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information terminal illustrated in FIG. 16A may transmit and receive data wirelessly. Through wireless communication, desired book data or the like can be purchased and downloaded from an e-book server.

Furthermore, the housing 902 in FIG. 16A may be equipped with an antenna, a microphone function, and a wireless communication function to be used as a mobile phone.

Figure 16B:
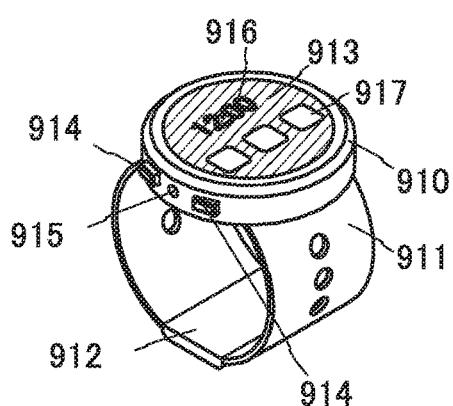

FIG. 16B illustrates a wrist-watch-type portable information terminal, which includes a housing 910, a band 911, and a clasp 912. The housing 910 includes a display portion 913, an operation portion 914, and a sensor 915. The display portion 913 has a touch sensor function, and can be operated by touching a time display portion 916 and icons 917. The housing 910 is provided with a display module including the semiconductor device described in the above embodiment. Thus, a wrist-watch-type portable information terminal with a narrower frame and improved display quality can be obtained.

Figure 16C:
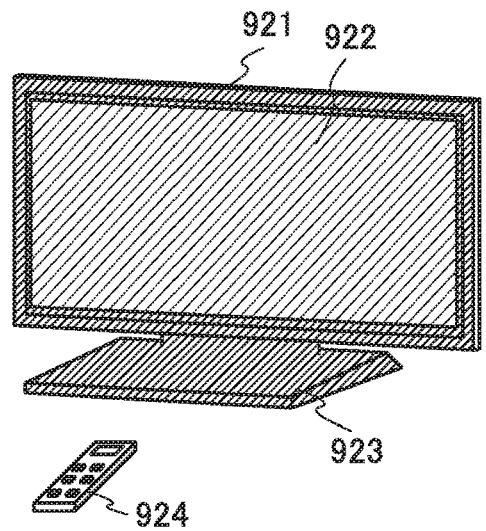

FIG. 16C illustrates a television device, which includes a housing 921, a display portion 922, a stand 923, and the like. The television device 920 can be controlled by a switch of the housing 921 and a remote controller 924. A display module including the semiconductor device described in the above embodiment is mounted on the housing 921 and the remote controller 924. Thus, a television device with a narrower frame and improved display quality can be obtained.

Figure 16D:
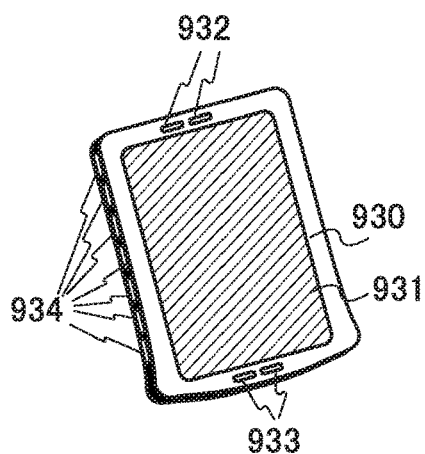

FIG. 16D illustrates a smartphone in which a main body 930 includes a display portion 931, a speaker 932, a microphone 933, operation buttons 934, and the like. A display module including the semiconductor device described in the above embodiment is provided in the main body 930. Thus, a smartphone with a narrower frame and improved display quality can be obtained.

Figure 16E:
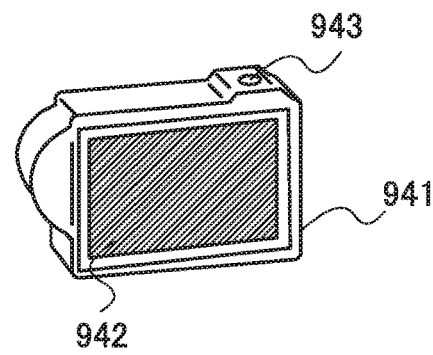

FIG. 16E illustrates a digital camera, which includes a main body 941, a display portion 942, an operation switch 943, and the like. A display module including the semiconductor device described in the above embodiment is provided in the main body 941. Thus, a digital camera with a narrower frame and improved display quality can be obtained.

As described above, a display module including the semiconductor device described in the above embodiment is provided in the electronic device shown in this embodiment. Thus, an electronic device with a narrower frame and improved display quality can be obtained.

Notes on Description in this Specification and the Like

The following are notes on the description of the above embodiments and structures in the embodiments.

Notes on One Embodiment of the Present Invention Described in Embodiments

One embodiment of the present invention can be constituted by appropriately combining the structure described in an embodiment with any of the structures described the other embodiments. In addition, in the case where a plurality of structure examples are described in one embodiment, any of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with a text in this specification.

By combining a diagram (or part thereof) described in one embodiment with another part of the diagram, a different diagram (or part thereof) described in the embodiment, and/or a diagram (or part thereof) described in another embodiment or other embodiments, much more diagrams can be formed.

Notes on Description for Drawings

In this specification and the like, terms for describing arrangement, such as "over" and "under", are used for convenience to indicate a positional relation between components with reference to drawings. The positional relation between components is changed as appropriate in accordance with a direction in which the components are described. Therefore, the terms for explaining arrangement are not limited to those used in this specification and may be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can also mean the case where another component is provided between the insulating layer A and the electrode B.

Furthermore, in a block diagram in this specification and the like, components are functionally classified and shown by blocks that are independent of each other. However, in an actual circuit and the like, such components are sometimes hard to classify functionally, and there is a case where one circuit is associated with a plurality of functions or a case where a plurality of circuits are associated with one function. Therefore, the segmentation of blocks in a block diagram is not limited by any of the components described in the specification and can be differently determined as appropriate depending on the situation.

In the drawings, the size, the layer thickness, or the region is determined arbitrarily for description convenience; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

Notes on Expressions that can be Rephrased

In this specification and the like, the terms "one of a source and a drain" (or first electrode or first terminal) and "the other of the source and the drain" (or second electrode or second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification and the like, "voltage" and "potential" can be replaced with each other. The term "voltage" refers to a potential difference from a reference potential. When the reference potential is a ground voltage, for example, "voltage" can be replaced with "potential". The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases.

Note that a liquid crystal display device which has a 1T-1C circuit configuration where one pixel includes one transistor and one capacitor and an EL display device which has a 2T-1C circuit configuration where one pixel includes two transistors and one capacitor are described in this specification and the like; however, one embodiment of the present invention is not limited thereto. It is possible to employ a circuit configuration where one pixel includes three or more transistors and two or more capacitors. Moreover, a variety of circuit configurations can be obtained by formation of an additional wiring.

Notes on Definitions of Terms

The following are definitions of the terms not mentioned in the above embodiments.
<<Switch>>

In this specification and the like, a switch is in a conductive state (on state) or in a non-conductive state (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.
<<Channel Length>>

In this specification and the like, the channel length refers to, for example, a distance between a source and a drain in a region where a semiconductor (or a portion where a current flows in a semiconductor when a transistor is on) and a gate overlap with each other or a region where a channel is formed in a plan view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value, in a region where a channel is formed.
<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed.

In one transistor, channel widths in all regions are not necessarily the same. In other words, the channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of the transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

<<Pixel>>

In this specification and the like, one pixel refers to one element whose brightness can be controlled, for example. Therefore, for example, one pixel corresponds to one color element by which brightness is expressed. Accordingly, in a color display device using color elements of red (R), green (G), and blue (B), the smallest unit of an image is formed of three pixels of an R pixel, a G pixel, and a B pixel.

Note that the number of colors for color elements is not limited to three, and more colors may be used. For example, RGBW (W: white) or RGB added with yellow, cyan, or magenta may be employed.

<<Display Element>>

In this specification and the like, a display element includes a display medium whose contrast, luminance, reflectivity, transmittance, or the like is changed by electrical or magnetic effect. Examples of the display element include an electroluminescent (EL) element, an LED chip (e.g., a white LED chip, a red LED chip, a green LED chip, and a blue LED chip), a transistor (a transistor that emits light depending on current), an electron emitter, a display element using a carbon nanotube, a liquid crystal element, electronic ink, an electrowetting element, an electrophoretic element, a plasma display panel (PDP), a display element using microelectromechanical systems (MEMS) (e.g., a grating light valve (GLV), a digital micromirror device (DMD), a digital micro shutter (DMS), Mirasol (registered trademark), an interferometric modulator display (IMOD) element, a MEMS shutter display element, an optical-interference-type MEMS display element, and a piezoelectric ceramic display), and quantum dots. Examples of a display device having an EL element include an EL display. Examples of display devices having electron emitters include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. Examples of display devices containing quantum dots in each pixel include a quantum dot display. Note that quantum dots may be provided not as display elements but as part of a backlight. The use of quantum dots enables display with high color purity. In the case of a transflective liquid crystal display or a reflective liquid crystal display, some or all of pixel electrodes may serve as reflective electrodes. For example, some or all of pixel electrodes may contain aluminum, silver, or the like. In such a case, a memory circuit such as an SRAM can be provided under the reflective electrodes, leading to lower power consumption. Note that in the case of using an LED chip, graphene or graphite may be provided under an electrode or a nitride semiconductor of the LED chip. Graphene or graphite may be a multilayer film in which a plurality of layers are stacked. When graphene or graphite is provided in this manner, a nitride semiconductor, for example, an n-type GaN semiconductor layer including crystals can be easily formed thereover. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In the case of a display element including MEMS, a drying agent may be provided in a space where the display element is sealed (or between an element substrate over which the display element is placed and a counter substrate opposed to the element substrate, for example). Providing a drying agent can prevent MEMS and the like from becoming difficult to move or deteriorating easily because of moisture or the like.

<<Connection>>

In this specification and the like, the expression "A and B are connected" or "A is connected to B" means the case where A and B are electrically connected to each other as well as the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path," and "a source (or a first terminal or the like) of a transistor is electrically connected to X through Z1 at least with a first connection path, the first connection path does not include a second connection path, the second connection path includes a connection path through the transistor, a drain (or a second terminal or the like) of the transistor is electrically connected to Y through Z2 at least with a third connection path, and the third connection path does not include the second connection path." Still another example of the expression is "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

This application is based on Japanese Patent Application serial no. 2015-115516 filed with Japan Patent Office on Jun. 8, 2015, the entire contents of which are hereby incorporated by reference.

What is claimed is:

1. A semiconductor device comprising:
    an input terminal electrically connected to a flexible printed circuit;
    a shift register electrically connected to the input terminal, the shift register comprising:
        a first circuit including a plurality of first pulse output circuits configured to sequentially output first pulse signals in a first direction;
        a second circuit including a plurality of second pulse output circuits configured to sequentially output second pulse signals in a second direction; and
        a third circuit including a plurality of third pulse output circuit configured to sequentially output third pulse signals in the first direction,
    a first output terminal electrically connected to one of the plurality of first pulse output circuits;
    a second output terminal electrically connected to one of the plurality of second pulse output circuits;
    a first source line extending in a third direction from the first output terminal;
    a second source line extending in a fourth direction from the second output terminal;
    a first pixel directly connected to the first source line; and
    a second pixel directly connected to the second source line,
    wherein the first direction and the second direction are different from each other,
    wherein the third direction and the fourth direction are opposite to each other,
    wherein the first output terminal is adjacent to the flexible printed circuit with the input terminal interposed therebetween when seen from above,
    wherein the second output terminal is adjacent to the flexible printed circuit without interposing the input terminal when seen from above, and
    wherein the second circuit is positioned between the first circuit and the third circuit.

2. A display module comprising a display panel and the semiconductor device according to claim 1.

3. An electronic device comprising an operation portion and the display module according to claim 2.

4. The semiconductor device according to claim 1, wherein each of the first pixel and the second pixel comprises a transistor.

5. The semiconductor device according to claim 1, wherein each of the first pixel and the second pixel comprises a liquid crystal element or a light-emitting element.

6. A semiconductor device comprising:
    an input terminal electrically connected to a flexible printed circuit;
    a shift register electrically connected to the input terminal, the shift register comprising:
        a first circuit including a plurality of first pulse output circuits configured to sequentially output first pulse signals in a first direction;
        a second circuit including a plurality of second pulse output circuits configured to sequentially output second pulse signals in a second direction; and
        a third circuit including a plurality of third pulse output circuit configured to sequentially output third pulse signals in the first direction,
    a first output terminal electrically connected to one of the plurality of first pulse output circuits;
    a second output terminal electrically connected to one of the plurality of second pulse output circuits;
    a first source line extending in a third direction from the first output terminal;
    a second source line extending in a fourth direction from the second output terminal;
    a first pixel directly connected to the first source line;
    a second pixel directly connected to the second source line; and
    a video signal generation circuit,
    wherein the first direction and the second direction are different from each other,
    wherein the third direction and the fourth direction are opposite to each other, wherein the first output terminal is adjacent to the flexible printed circuit with the input terminal interposed therebetween when seen from above, wherein the second output terminal is adjacent to the flexible printed circuit without interposing the input terminal when seen from above, wherein the second circuit is positioned between the first circuit and the third circuit, wherein the video signal generation circuit is configured to generate first video signals in response to the first pulse signals, and wherein the video signal generation circuit is configured to generate second video signals in response to the second pulse signals.

7. A display module comprising a display panel and the semiconductor device according to claim 6.

8. An electronic device comprising an operation portion and the display module according to claim 7.

9. The semiconductor device according to claim 6, wherein each of the first pixel and the second pixel comprises a transistor.

10. The semiconductor device according to claim 6, wherein each of the first pixel and the second pixel comprises a liquid crystal element or a light-emitting element.

* * * * *